(12) United States Patent
Ando et al.

(10) Patent No.: US 7,102,155 B2
(45) Date of Patent: Sep. 5, 2006

(54) ELECTRODE SUBSTRATE, THIN FILM TRANSISTOR, DISPLAY DEVICE AND THEIR PRODUCTION

(75) Inventors: Masahiko Ando, Hitachinaka (JP); Masaya Adachi, Hitachi (JP); Hiroshi Sasaki, Mito (JP); Masatoshi Wakagi, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 148 days.

(21) Appl. No.: 10/786,567

(22) Filed: Feb. 25, 2004

(65) Prior Publication Data

US 2005/0051770 A1 Mar. 10, 2005

(30) Foreign Application Priority Data

Sep. 4, 2003 (JP) ............................. 2003-312079

(51) Int. Cl.
*H01L 29/08* (2006.01)
(52) U.S. Cl. ............................. 257/40; 257/59; 257/72; 257/347; 257/387
(58) Field of Classification Search ................ 257/59, 257/72, 347, 387, 40; 438/158–161
See application file for complete search history.

(56) References Cited

U.S. PATENT DOCUMENTS 6,828,582 B1 * 12/2004 Ando et al. .................... 257/40
2004/0129978 A1 * 7/2004 Hirai .......................... 257/347

FOREIGN PATENT DOCUMENTS

| JP | 08-264793 | 10/1996 |
| JP | 2003-209339 | 7/2003 |
| JP | 2003-209340 | 7/2003 |

OTHER PUBLICATIONS

Nikkei Electronics, Jun. 17, 2002, pp. 67-78.

* cited by examiner

*Primary Examiner*—Mark V. Prenty
(74) *Attorney, Agent, or Firm*—Hogan & Hartson LLP

(57) ABSTRACT

In the present invention, a lower electrode is utilized as a photomask to form a liquid-repellent region having a generally same pattern shape as that of the lower electrode and a liquid-attracting region having a generally reversed pattern shape on an insulating film. A conductive ink is coated and calcined in the liquid-attracting region to form an upper electrode having a generally reversed pattern shape to the lower electrode in a self-aligned manner, eliminating the occurrence of misregistration even when a printing method is used. Consequently, semiconductor devices such as an active matrix thin film transistor substrate can be formed using a printing method.

11 Claims, 16 Drawing Sheets (a)

(b)　　　　　(c)　　　　　(d)

ELECTRODE SUBSTRATE, THIN FILM TRANSISTOR, DISPLAY DEVICE AND THEIR PRODUCTION

BACKGROUND OF THE INVENTION

The present invention relates to an electrode substrate in which a lower electrode and an upper electrode face each other with an insulating film therebetween and a semiconductor device using the same such as a thin film transistor and a display device, particularly to an electrode substrate in which a lower electrode and an upper electrode whose main shapes are formed as reversed patterns of each other are placed in a self-aligned manner to each other and a semiconductor device such as a thin film transistor and a display device using the above described electrode substrate, and to a method for producing them.

An electrode substrate in which a lower electrode and an upper electrode face each other with an insulating film therebetween includes, for example, the electrode substrate for use in a thin film transistor for an active matrix driving liquid crystal display device. In this electrode substrate, the lower electrode as a gate wiring/electrode, the gate insulating film, and the upper electrode as a source/drain electrode and signal wiring are formed in this order by lamination on a substrate comprised of glass or the like. In order to form a thin film transistor and a display device driven by the same on a substrate having a large area with a high degree of accuracy, the lower electrode and upper electrode for composing wirings/electrodes each need to be processed to form a fine pattern and placed in an accurate alignment with each other. Therefore, so called photolithography method each using separate photomasks is used as a general method to process and form the lower and upper electrodes. In this method, a photomask that is preliminarily processed to form a fine pattern is placed to a (positive type) photoresist deposited on the electrode; the photoresist is subjected to photoirradiation and removed from an exposed region; the electrode is processed by removing the electrode from the uncovered region of the photoresist; and finally the photoresist is removed. The accurate alignment of the photomask to be used for processing each electrode allows each electrode pattern to be accurately aligned.

A back-surface exposure method is known as a method for accurately aligning a lower electrode and an upper electrode. The present invention comprises a method for utilizing "a part" of a lower metal electrode in an auxiliary manner as a photomask for determining "a part" of the pattern shape of an upper electrode. The detail of this method is described, for example, in Japanese Patent No. 3,304,671 by the same inventor.

In recent years, a method for using a printing method that is so called direct-drawing method such as inkjet, plating, and offset printing has been actively studied as a method for forming the electrode for use in these electrode substrates, as described, for example, in Nikkei Electronics, No. 6.17, pp. 67–78, 2002. In these printing methods, necessary materials are placed and formed in necessary locations. Therefore, these printing methods have less number of production processes and higher utilization efficiency of materials than a photolithography process, leading to an expectation to an advantage that an electrode substrate can be formed at a low cost. The above literature introduces an example in which a metal wiring having a line width of 5 μm or less has been formed by an inkjet method, as an example in which a fine electrode pattern has been formed by using a printing method.

A thin film transistor using the electrode substrate described above is utilized in an active matrix driving display device, and used in a flat image-display device using, for example, liquid crystal elements, organic electroluminescent elements, electrophoresis elements and the like as display elements. In addition, there is a move in which a thin film transistor using the above electrode substrate is utilized to RFID, a non-contact information medium, typified by a non-contact IC card. In either case, a thin film transistor is utilized in basic products that support an advanced information-oriented society as a man-machine interface device through the medium of image and communication information.

In the above prior arts, if a photolithography method can be replaced by a printing method as a method for forming an electrode substrate in which a lower electrode and an upper electrode, which have fine pattern shapes and are accurately aligned to each other, face each other with an insulating film therebetween, production processes would be much reduced and utilization efficiency of materials would be improved, leading to an expectation of an advantage that a large number of electrode substrates can be formed at a low cost.

However, it has been difficult to use a printing method, particularly as a method for forming electrodes in the electrode substrate with the above construction due to the following reasons. Specifically, "misregistration" occurs when an electrode with a fine shape, which is formed using a printing method, is transferred onto a substrate from a printing device. This causes the problem that even when at least one of a lower electrode and an upper electrode formed thereon trough an insulating layer can be formed in a fine pattern shape using a printing method, the both cannot be aligned accurately. This will be described with reference to FIG. 12 which shows the problem of misregistration of electrodes in the electrode substrate according to the present invention. FIG. 12(a) shows a plan view illustrating electrodes that are well aligned and a sectional view taken along line A–A'; and FIGS. 12(b) to (d) are plan views illustrating electrodes with "misregistration". A lower electrode 2, an insulating film 3, and upper electrodes 5 and 6 are layered in this order on a substrate 1. In FIG. 12(a), both sides of the lower electrode 2 match with right end and left end of the upper electrodes 5 and 6 respectively, that is, they are well aligned. On the other hand, FIG. 12(b) shows an example in which the lower electrode 2 has shifted to the lower right on the substrate surface; FIG. 12(c) shows an example in which the upper electrodes 5 and 6 have shifted to the upper left on the surface of the insulating film; and FIG. 12(d) shows an example in which both misregistrations have occurred. The occurrence of misregistration causes loss of the matching of position between the lower electrode 2 and upper electrodes 5 and 6, and causes unnecessary overlapping and separation therebetween, even when electrodes are formed in fine patterns. It is known that, in the case of an inkjet method, such "misregistration" occurs while a conductive ink ejected from a head part is flying until it attaches a substrate, and in the case of a transfer printing method, it occurs when a pattern of a conductive ink is transferred from a transfer roll to a substrate.

This results in a problem that when an electrode substrate of the above construction without the defect of electrode misregistration, it is necessary to use a photolithography method in at least a part of the processes, which prevents the reduction of production processes and improvement of utilization efficiency of materials. Further, there is a problem that when a thin film transistor and a semiconductor device such as a display device using the same are produced using the electrode substrate in which misregistration has occurred as a result of production by a printing method, the performance and uniformity of devices are low and devices cannot be highly integrated with higher definition.

To these problems, it is an object of the present invention to provide an electrode substrate and a method for producing the same in which a lower electrode and an upper electrode, which have fine pattern shapes and are accurately aligned to each other, face each other in self-alignment with an insulating film therebetween, by using a printing method in place of a photolithography method, and to provide a semiconductor device such as a thin film transistor and a display device using the above described electrode substrate and a method for producing the same.

SUMMARY OF THE INVENTION

As means for solving the above problems, a method described below is used as a method for producing an electrode substrate comprising a substrate, an opaque lower electrode, a light-transmitting insulating film having a liquid-repellent/a liquid-attracting region on the surface thereof and an upper electrode, wherein the lower electrode, the insulating film and the upper electrode are layered in this order on the substrate, wherein a pattern shape of the lower electrode generally matches with that of the liquid-repellent region on the surface of the insulating film, wherein the upper electrode is mainly formed on the liquid-attracting region outside the liquid-repellent region on the surface of the insulating film, such that the pattern shape of the upper electrode is a self-aligned shape in which the pattern shape of the lower electrode is generally reversed. First, as a member for providing the liquid-repellent region on the surface of the insulating film, a photosensitive liquid-repellent film is subjected to pattern processing using a so-called back-surface exposure method in which the photosensitive liquid-repellent film, in which light-irradiation changes its property from a liquid-repellent property that repels liquid dropped on the surface to a liquid-attracting property that the liquid wets the surface and spreads, is used to be subjected to the light-irradiation from the back-surface of the substrate using the lower electrode as a photomask. Namely, the photosensitive liquid-repellent film is removed to form the liquid-attracting region on the surface of the insulating film that is not shielded by the lower electrode, and the photosensitive liquid-repellent film having a generally same shape as that of the lower electrode remains to form the liquid-repellent region on the surface of the insulating film that is shielded by the lower electrode. The upper electrode, which has a pattern shape that is a generally reversed shape of the pattern shape of the lower electrode, is formed in a self-aligned manner by dropping a conductive ink, in which at least one of metallic ultrafine particles, metal complexes, and conductive polymers is dispersed in a solvent, mainly on the liquid-attracting region of the surface of this insulating film and subjecting it to coating and calcining.

Further, there is formed a thin film transistor comprising an electrode substrate and a semiconductor film, wherein, on the electrode substrate, a gate electrode is formed as the lower electrode, and a source electrode and a drain electrode are formed as the upper electrodes on the liquid-attracting regions separated to two or more by the liquid-repellent region formed on the surface of the insulating film in a pattern shape that generally matches with the lower electrode, such that the pattern of the upper electrodes has a generally reversed shape of the lower electrode, the gate electrode, and placed in a self-aligned manner to the gate electrode; and wherein the semiconductor film is formed such that it extends over and covers at least a part of each of the source electrode, drain electrode and the liquid-repellent region on the surface of the insulating film (gate electrode region) lying therebetween on the above electrode substrate.

Further, there is formed an active matrix thin film transistor substrate comprising an electrode substrate and thin film transistors having semiconductor films, wherein, on the electrode substrate, a plurality of gate wirings/electrodes is formed as the lower electrodes, and a plurality of signal wirings, source/drain electrodes and pixel electrodes are formed as the upper electrodes on the liquid-attracting regions separated to plural numbers by the liquid-repellent regions formed on the surface of the insulating film in a pattern shape that generally matches with the lower electrodes; wherein the semiconductor films are formed such that they extend over and cover at least a part of each of the source electrodes, drain electrodes and liquid-repellent regions (gate wiring/electrode regions) on the surface of the insulating films lying therebetween on the electrode substrate; and wherein the thin film transistors are each placed at each intersection of the gate wiring and signal wiring.

Further, there is formed the active matrix thin film transistor substrate, wherein a plurality of gate wirings/electrodes, having a shape in which a plurality of adjacently placed ring-shaped rectangles each having an opening is connected to each other at least at one or more locations, are adjacently formed to each other as the lower electrodes; wherein signal wirings and source/drain electrodes are each formed on the space between the rectangles in a continuous shape spreading over the connection in a self-aligned manner to the gate wirings/electrodes as the upper electrodes; and wherein the pixel electrodes are each formed in an opening of the ring-shaped rectangle. In particular, in the shape and configuration of the plurality of gate wirings/electrodes, there is formed the active matrix thin film transistor substrate, wherein the width of the connection part for connecting each of a plurality of ring-shaped rectangles each having an opening in gate wirings/electrodes and the width of the space between a plurality of gate wirings/electrodes are smaller than the width of the space between a plurality of ring-shaped rectangles each having an opening for composing gate wirings/electrodes.

A photosensitive liquid-repellent monolayer comprising a carbon chain in which at least a part thereof is terminated with fluorine or hydrogen is used as a photosensitive liquid-repellent film in place of a photoresist.

Further, as a method for producing the electrode substrate having the above characteristics, on the surface of a light-transmitting substrate on which an opaque lower substrate, a light-transmitting insulating film and a photosensitive liquid-repellent film are layered in this order, a photocatalytic material, which is comprised of titanium oxide, nitrogen-doped titanium oxide, strontium titanate or the like which shows photocatalysis with the light having the wavelengths that transmit the substrate, insulating film and photosensitive liquid-repellent film and does not transmit the lower electrode, is adjacently placed or adhered and is subjected to back-surface exposure; and wherein the photosensitive liquid-repellent film is decomposed by the photocatalysis shown by the photocatalytic material that has absorbed the light that transmitted the substrate, insulating film and photosensitive liquid-repellent film to be processed to a pattern having a generally same shape as that of the lower electrode. When this method is used, an opaque material to the photosensitive wavelengths of the photosensitive liquid-repellent film may be used for at least one of the substrate or insulating film. As a method other than this, a so-called lift-off method, in which the photoresist formed on the insulating film is subjected to back-surface exposure to process and form to the same pattern shape as that of the lower electrode; the photosensitive liquid-repellent film is layered thereon; and then the photoresist is removed, can be used to subject the photosensitive liquid-repellent film to pattern processing to provide a generally same shape as that of the lower electrode.

The electrode substrate, thin film transistor, and active matrix thin film transistor substrate formed by the above configuration and production method are used to form a liquid crystal, electrophoresis, or organic electroluminescent display device. Further, semiconductor devices such as an RFID tag device are formed using the above electrode substrate and thin film transistor to at least a part thereof.

According to the production method of the present invention, a photosensitive liquid-repellent monolayer is used as a photosensitive liquid-repellent film as described above in place of conventionally commonly used photoresists. The above photosensitive liquid-repellent monolayer is exposed using the lower electrode as a photomask to form a liquid-attracting/liquid-repellent pattern on the surface of the substrate. A conductive ink is coated and calcined on the liquid-attracting region of the substrate surface to form the pattern of the upper electrode. Since the pattern forming principle discovered by the inventor is utilized at this time, the shape of the lower electrode which is a photomask for defining the general shape of the upper electrode has the characteristics as described above.

Now, the principle of forming patterns used in the present invention will be described below. First, the difference as a photosensitive liquid-repellent film between the photosensitive liquid-repellent monolayer used in the present invention and conventional photoresists will be described. Since photoresists generally have a lower liquid-repellent property than the photosensitive liquid-repellent monolayer, but can form a thick film of about 1 μm, there is provided a step height between a liquid-repellent region (photoresist part) and a liquid-attracting region to hold a conductive ink utilizing the step height to form an electrode pattern. On the other hand, since the photosensitive liquid-repellent monolayer generally has a higher liquid-repellent property than photoresists, but forms a thin film of about 2 nm or less, it cannot utilize the step height effect like photoresists and typically confines the conductive ink within a liquid-attracting region by the liquid-repellent action to form an electrode pattern.

FIG. 11 shows the relation between liquid-attracting/liquid-repellent patterns formed by a photosensitive liquid-repellent monolayer and an electrode pattern formed by coating. The principle of forming patterns utilized in the present invention will be described using this figure. FIG. 11(1) to (3) shows the state where an electrode pattern of the same shape is formed relative to three different liquid-repellent patterns, as plan views and sectional views taken along line A–A' and B–B' for respective substrates. On a substrate 1 in each figure, a part in which a liquid-repellent film 4 comprised of a photosensitive monolayer is formed is a liquid-repellent region, and a part in which the liquid-repellent film 4 is not formed is a liquid-attracting region. Here, a region which has a so-called contact angle, that is made between a substrate surface and a water drop when pure water is dropped, of about 90° or more is defined as a liquid-repellent region, and a region having a contact angle of 45° or less as a liquid-attracting region. In FIG. 11(1), the liquid-repellent region has a ring-form having a closed outer periphery surrounding a rectangular liquid-attracting region inside. When a conductive ink is coated on this liquid-attracting region, the conductive ink does not wet and spread over the liquid-repellent region but is confined within the liquid-attracting region. An electrode 5 having the same shape as the above described liquid-attracting region is obtained by calcining it. This is a general principle of forming patterns that can be obtained in the same manner when photoresists are used as a liquid-repellent film.

In FIG. 11(2), a part (right center part in this figure) of a ring-form liquid-repellent region in FIG. 11(1) is separated by an elongated liquid-attracting region. In this case, when a conductive ink is coated on the rectangular liquid-attracting region, almost all of the outer periphery thereof being surrounded by the liquid-repellent region, the conductive ink neither wet and spread over the liquid-repellent region in the same manner as in FIG. 11(1), nor penetrate into the separated part of the liquid-repellent region, which is calcined to obtain an electrode having generally the same shape as in FIG. 11(1). It has been found that a necessary condition where the conductive ink does not leak from the separated part of the liquid-repellent region requires that the space of the part separated by the liquid-attracting region is smaller than the shortest space of the liquid-attracting region (short side for the rectangle shown in this figure). This is understood to occur due to a general property of liquid that the conductive ink that is dropped tends to minimize the surface area (surface energy) as much as possible. Such an effect in which the conductive ink, a liquid material held within a relatively wider liquid-attracting region, does not penetrate into a relatively narrower liquid-attracting region which is connected to the former region is hereinafter referred to as "non-penetrating effect of conductive ink".

In FIG. 11(3) on the other hand, the ring-form liquid-repellent region in FIG. 11(1) is connected by an elongated liquid-repellent region at the central part thereof, resulting in separation of a rectangular liquid-attracting region surrounded by the liquid-repellent region to upper and lower parts. Also in this case, when a sufficient amount of conductive ink is coated on the rectangular liquid-attracting region, the outer periphery thereof being surrounded by the liquid-repellent region, the conductive ink does not wet and spread over the liquid-repellent region in the same manner as in FIG. 11(1), but wets and spreads over the above described elongated connecting part of the liquid-repellent region, combining the conductive ink coated on the two upper and lower liquid-attracting regions into one, which is calcined to obtain an electrode having generally the same shape as in FIG. 11(1). It has been found that a necessary condition, where the conductive ink coated on two liquid-attracting regions is combined into one by flowing over the liquid-repellent region separating the two regions, requires that the width of the elongated liquid-attracting region separating the liquid-attracting region is smaller than the shortest space of the liquid-attracting region for dropping the conductive ink (short side for the rectangle shown in this figure). This is understood to occur due to a general property of liquid that the conductive ink that is dropped tends to minimize the surface area (surface energy) as much as possible by taking one combined shape rather than taking two separated shapes. Such an effect in which the conductive ink, a liquid material held within relatively wider liquid-attracting regions separated into two by a relatively narrower liquid-repellent region, flows over the above described narrow liquid-repellent region to be combined into one is hereinafter referred to as "crosslinking effect of conductive ink". This crosslinking effect cannot be obtained when using photoresists having the step height as a member for forming the liquid-repellent region, but can only be obtained when using the photosensitive liquid-repellent monolayer having almost no step height as in the present invention.

In the present invention, in order to form an upper electrode using a conductive ink, utilizing the above described "non-penetrating effect of conductive ink" and "crosslinking effect of conductive ink", the above described devices are used for the shape of a photosensitive liquid-repellent film and the shape of a lower electrode used as the photomask determining the shape of the photosensitive liquid-repellent film. The detail will be specifically described in examples below.

According to the present invention, the pattern of the upper electrode has a shape in which the lower electrode is generally reversed by the above effects, and so is aligned to the lower electrode in a self-alignment manner. Therefore, when a printing method such as inkjet capable of forming fine patterns is used as a method for forming a lower electrode, the upper pattern formed by the printing method is also a fine pattern, and is also aligned to the lower electrode in a self-alignment manner. Thus, it is possible to form an electrode substrate in which a lower electrode and an upper electrode, which have fine pattern shapes and are accurately aligned to each other in an self-alignment manner, face each other with an insulating film therebetween, without using a photolithography method, and to provide a semiconductor device such as a thin film transistor and a display device using the same.

Other objects, features and advantages of the invention will become apparent from the following description of the embodiments of the invention taken in conjunction with the accompanying drawings.

According to the present invention, since an upper electrode having a reversed pattern shape of a lower electrode is formed using liquid-attracting/liquid-repellent regions formed by the photosensitive liquid-repellent film to which the pattern shape of the lower electrode is transferred utilizing the lower electrode itself as a photomask, the lower electrode and the upper electrode are aligned in a self-alignment manner, and the misregistration will not occur even when the lower electrode is formed by a printing method. Consequently, an electrode substrate in which a lower electrode and an upper electrode are accurately aligned through an insulating film can be formed by a printing method. Wirings/electrodes placed in self-alignment crossing each other through an insulating film can be printed by devising the pattern shape of a lower electrode so that the non-penetration effect and the crosslinking effect of conductive ink can be utilized when coating and forming an upper electrode using the conductive ink. The effect of reducing the number of processes for producing an electrode substrate by a printing method is shown in FIG. 16. A conventional photolithography method requires eight processes for forming one electrode, that is, 19 processes in total. On the other hand, the use of the printing method of the present invention allows the production by seven processes, less than the half of the conventional method, the effect of improving productivity being obvious.

Figure 15:
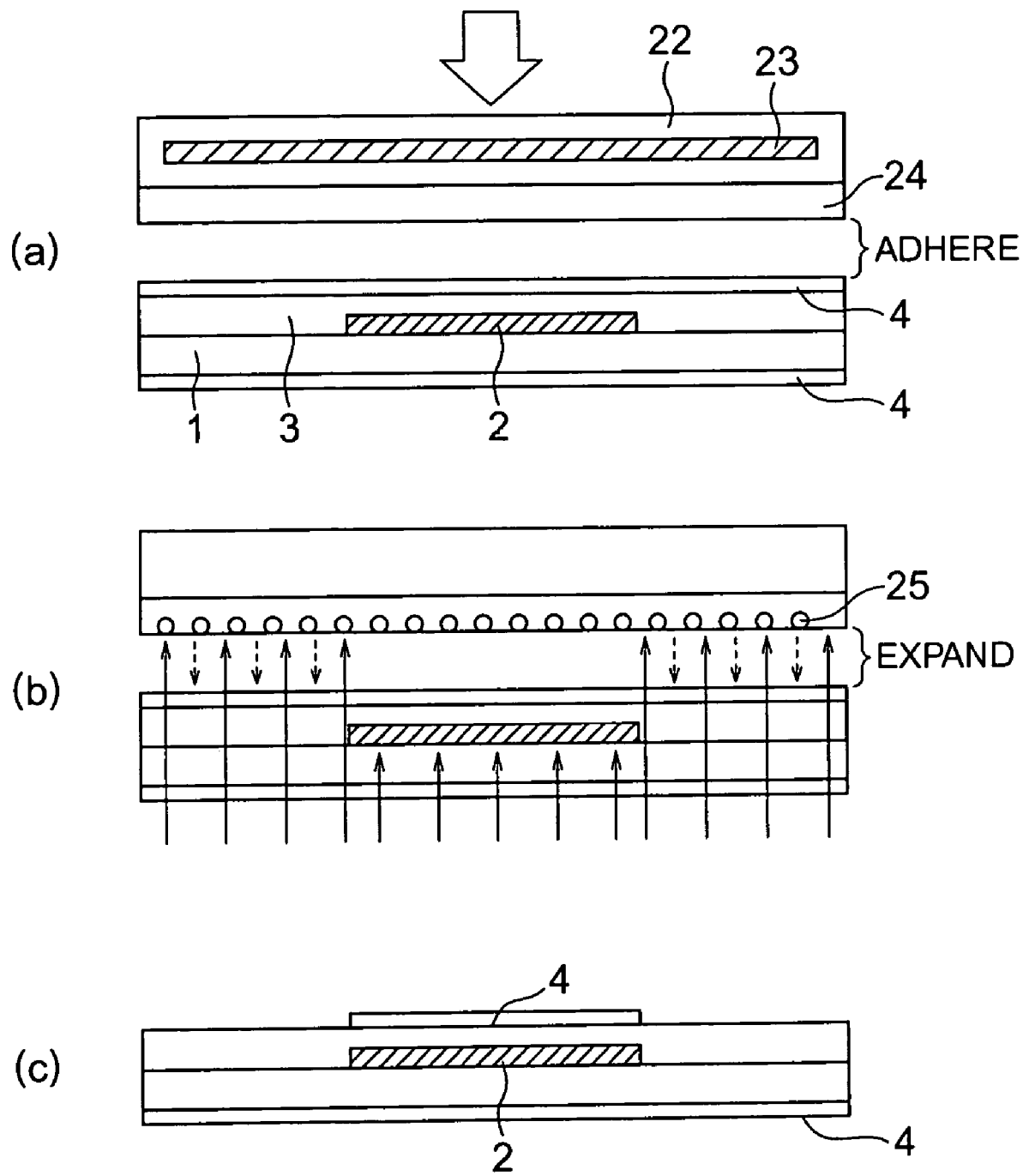
Figure 16A:
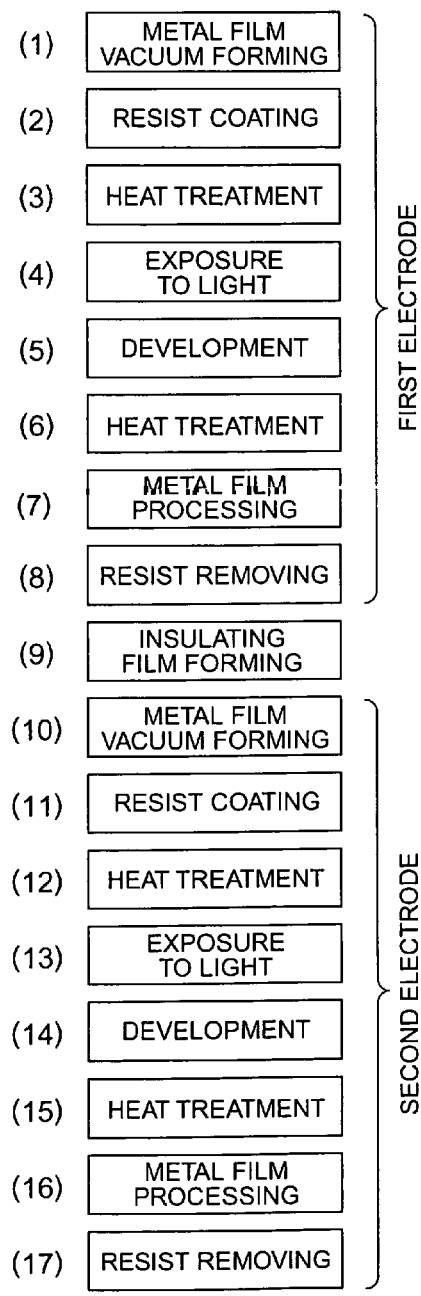
Figure 16B:
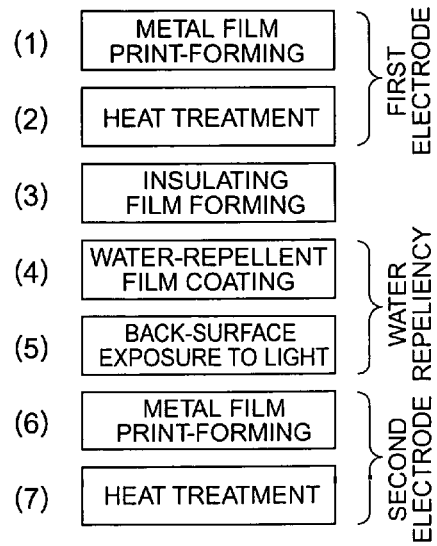

Fog. 14 is a plan view and a sectional view illustrating main device configuration of a display device of the present invention;

FIG. 15 is a view illustrating a back-surface exposure method of a photosensitive liquid-repellent film and device configuration of the present invention; and FIGS. 16A and 16B are views illustrating the effect of reducing the number of processes for producing an electrode substrate of the present invention.

The meaning of reference numerals is as follows:
1 . . . substrate, 2 . . . lower electrode, gate wiring/electrode, 3 . . . insulating film, 4 . . . photosensitive liquid-repellent film, 5 . . . upper electrode, signal wiring/drain electrode, 6 . . . upper electrode, pixel electrode/source electrode, 7 . . . semiconductor film, 8 . . . ring-shaped rectangle having opening of gate wiring electrode, 9 . . . connection part of gate wiring, 10 . . . space between adjacent gate wirings/electrodes, 11 . . . gate terminal, 12 . . . lower electrode for forming signal terminal, 13 . . . signal terminal, 14 . . . protective film, 15 . . . through hole, 16 . . . active matrix thin film transistor substrate, 17 . . . gate scanning circuit, 18 . . . signal circuit, 19 . . . control circuit, 20 . . . display element, 21 . . . opposing electrode, 22 . . . heating mechanism, 23 . . . supporting plate, 24 . . . photocatalyst, 25 . . . hole.

PREFERRED EMBODIMENTS OF THE INVENTION

Figure 13:
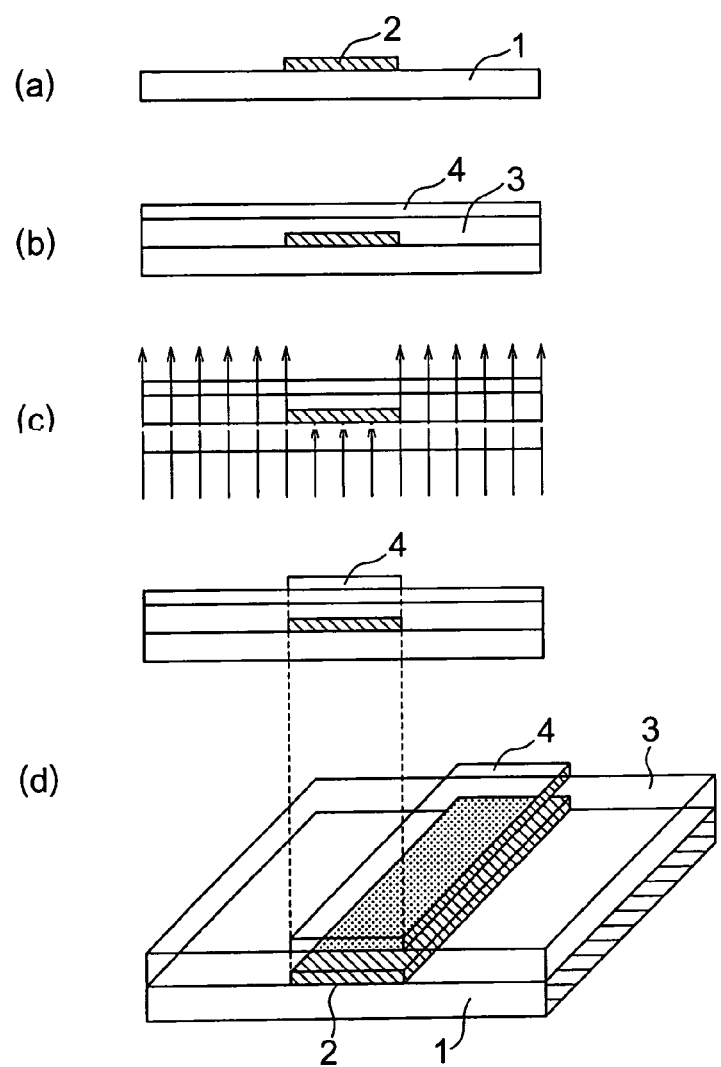
FIG. 13 is a view illustrating a back-surface exposure patterning method of a photosensitive liquid-repellent film of the present invention.

Hereinafter, several examples of the present invention will be specifically described with reference to drawings. First, a light patterning method by back-surface exposure of a photosensitive liquid-repellent film, which is a common technology, will be described with reference to FIG. 13.

First, there is provided an electrode substrate in which a lower electrode 2, a light-transmitting insulating film 3 and a photosensitive liquid-repellent film 4 are layered in this order on a light-transmitting substrate 1. For example, a quartz substrate having a thickness of 1 mm is used as the substrate 1; a Cr thin film having a thickness of 140 nm is used as the lower electrode 2; a silicon oxide film having a thickness of 400 nm is used as the insulating film 3; and a fluorinated alkyl-based silane coupling agent typified by $CF_3(CF_2)_7(CH)_2SiCl_3$ and the like, which is a liquid-repellent monomer having a carbon chain terminated with a fluorine group in at least a part thereof is used as the photosensitive liquid-repellent film 4, and these are formed in the following methods respectively. The lower electrode 2 was formed by depositing a Cr thin film having a thickness of 400 nm at a substrate temperature of 200° C. using a DC magnetron sputtering device and then processing it by using a ceric ammonium nitrate solution as an etching solution in a photolithography method (FIG. 13(a)). The insulating film 3 was deposited at a substrate temperature of 350° C. using a plasma chemical vapor deposition method (plasma CVD method), using tetraethoxysilane (TEOS) and oxygen ($O_2$) as source gases. The photosensitive liquid-repellent film 4 was formed by thoroughly cleaning the surface of the substrate 1 on which the lower electrode 2 and the insulating film 3 are layered in this order, then coating a solution prepared by dispersing the above silane coupling agent in a fluorine-based solvent by spin coating, dip coating, spraying or the like and drying it (FIG. 13(b)). The above substrate was subjected to so-called back-surface exposure by irradiating the back surface with the light emitted by a low pressure mercury lamp for about 30 minutes (FIG. 13(c)). The light path of radiation is indicated by arrows in the figure. After the completion of the back-surface exposure, the photosensitive liquid-repellent film 4 is removed from the light-irradiated region (non-shielding region by the lower electrode) on the surface of the insulating film 3 to form a liquid-attracting region, and the photosensitive liquid-repellent film remains on the non-irradiated region (shielding region by the lower electrode) on the surface of the insulating film 3 to form a liquid-repellent region. This was confirmed by the following methods. The presence or absence of the photosensitive liquid-repellent film was determined by determining the presence or absence of a fluorine element using photoelectron spectroscopy such as XPS and UPS, and TOF-SIMS (Time-of-Flight Secondary Ion Mass Spectrometry). In addition, a contact angle was measured by dropping pure water on the surface of the insulating film 3. The non-irradiated region showed a contact angle of 100° to 120°, while the light-irradiated region showed 30° or less. In addition, when the substrate was immersed in pure water and pulled up, the pure water adhered only to the light-irradiated region (non-shielding region by the lower electrode) on the surface of the insulating film 3, and the overlapping width at the edges of the pure water and the lower electrode 2 as observed in the vertical direction to the substrate was 1 μm or less.

From the above results, it was ascertained that the photosensitive liquid-repellent film 4 is processed to a generally same pattern shape as that of the lower electrode 2 by the back-surface exposure method utilizing the lower electrode 2 as a photomask (FIG. 13(d)).

In the following examples, the shape of the lower electrode 2 that is used as a photomask is devised depending on purposes so that the photosensitive liquid-repellent film is processed to a generally same pattern shape as that of the lower electrode 2. At this time, the shape of the lower electrode 2 and that of the photosensitive liquid-repellent film 4 are overlapped in a plan view of an electrode substrate, and so they cannot be distinguishably expressed. In the following figures, the description of 2 and 4 in a figure means that the photosensitive liquid-repellent film 4 is disposed on the lower electrode 2 in a generally same shape. The substrate 1 and the insulating film 3 are also described by 1 and 3 in a plan view as the same meaning.

EXAMPLE 1

Figure 1:
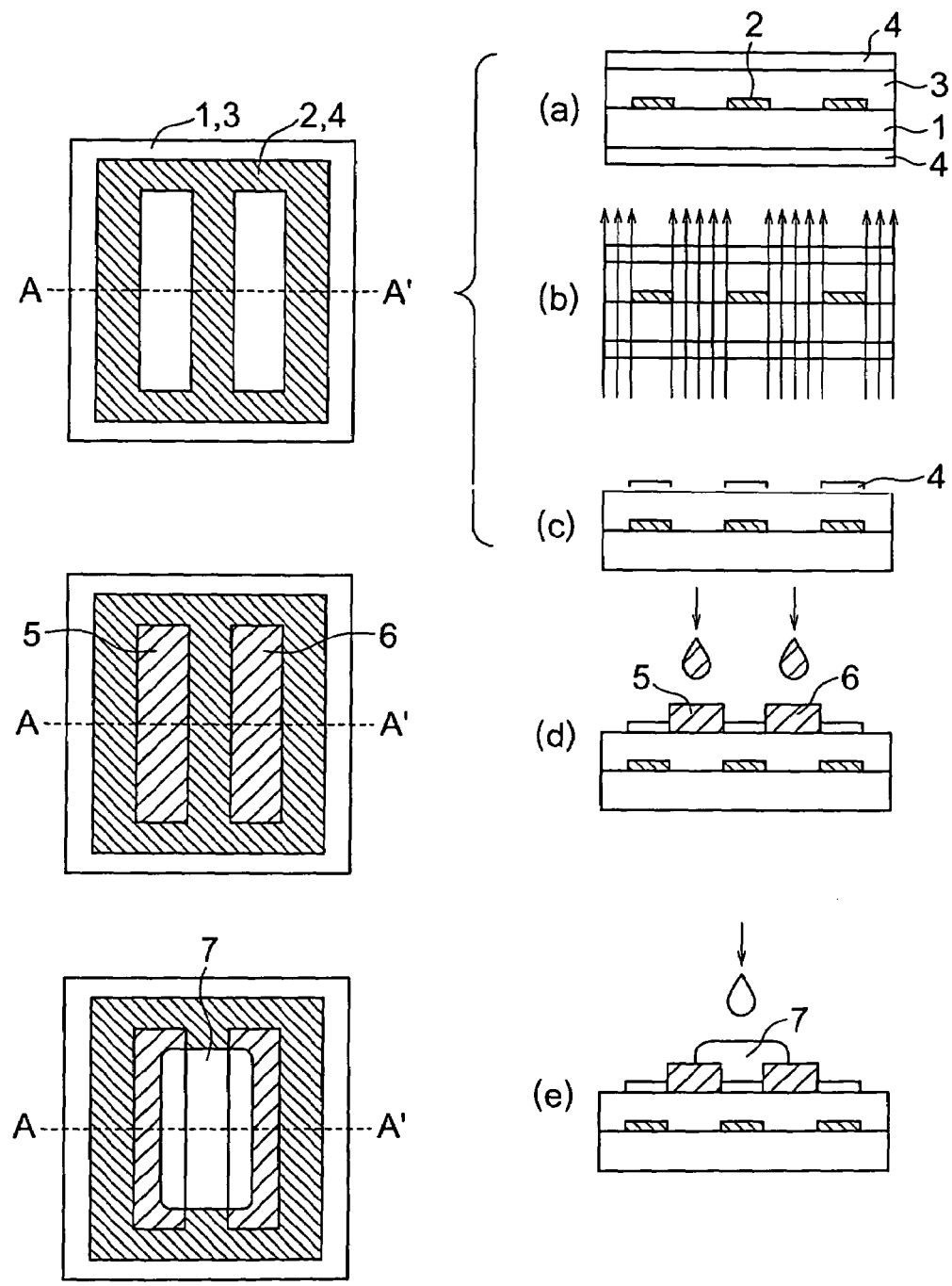
FIG. 1 is a plan view and a sectional view illustrating one example of an electrode substrate and a thin film transistor of the present invention, and their production.

FIG. 1 shows a plan view and a sectional view illustrating one example of an electrode substrate and a thin film transistor of the present invention and their production. The lower electrode 2 and the insulating film 3 are layered in this order on the substrate 1, for example, using the same members and forming method as those in FIG. 13. However, in the present example, the pattern shape of a gate electrode which is the lower electrode 2 has two openings placed adjacent to each other. In addition, in the present invention, as the photosensitive liquid-repellent film 4 is coated by a dip coating method, the photosensitive liquid-repellent film 4 adheres to the back surface of the substrate 1 other than the insulating film 3 (FIG. 1(a)). By back-surface exposure, the photosensitive liquid-repellent film 4 is removed from the back surface of the substrate 1, and forms a liquid-repellent region having a generally same pattern shape as that of the lower electrode 2 on the surface of the insulating film 4 (FIG. 1(b) to (c)). A conductive ink, which is composed of a liquid material containing at least one of metallic ultrafine particles, metal complexes and conductive polymers, is coated on two liquid-attracting regions surrounded by the liquid-repellent region formed on the insulating film 3 and calcined to form upper electrodes 5 and 6 (FIG. 1(d)). The conductive ink that may be used includes a liquid material having properties that it is repelled from the liquid-repellent region formed by the photosensitive liquid-repelled film 4 and it wets and spreads over the liquid-attracting region from which the photosensitive liquid-repellent film 4 is removed, and showing a sufficiently low resistance value after the calcining. A specific material that can be used includes a solution in which metallic ultrafine particles or metal complexes mainly composed of Au, Ag, Pd, Pt, Cu, Ni or the like and having a diameter of about 10 nm or less are dispersed in a solvent such as water, toluene or xylene. Further, for forming ITO (indium tin oxide) of a transparent electrode material, a solution in which metal alkoxides such as $In(O-i-C_3H_7)_3$ and $Sn(O-i-C_3H_7)_3$ are dispersed in a water, alcohol solvent. Furthermore, an aqueous solution of PEDOT (poly-3,4-ethylenedioxythiophene), polyaniline (PAn), polypyrrole (PPy) or the like doped with PSS (polystyrene sulfonic acid), a conductive polymer such as, can also be used as the transparent electrode material other than this. It was possible to form the upper electrodes 5 and 6 having a film thickness of about 100 nm using any of the above materials by dropping them in an amount enough to cover the above two liquid-attracting regions and then calcining them at an appropriate temperature of about 80 to 500° C. in vacuum or in air. In the present example, the upper electrodes 5 and 6 were formed as two rectangular shapes on the liquid-attracting regions other than the liquid-repellent region on the surface of the insulating film, and the pattern shape was a self-aligned shape in which the pattern shape of the lower electrode 2 was generally reversed.

Cr was used as the lower electrode material in the above example, but any suitable opaque material to the exposure wavelengths may be used. For example, Al, Mo, Au, Ag, Pd, Cu, and the like may be used. Further, quartz, silicon oxide and a fluorinated alkyl-based silane coupling agent were used for the substrate 1, the insulating film 3 and the photosensitive liquid-repellent film 4, respectively, but any suitable material other than these may be used. However, the materials for the substrate 1 and the insulating film 3 are limited depending on the material for the photosensitive liquid-repellent film 4, because they need to transmit the exposure wavelengths of the photosensitive liquid-repellent film 4. A fluorinated alkyl-based silane coupling agent was used as the material for the photosensitive liquid-repellent film, but other materials may be used, provided they are liquid-repellent monomers having a carbon chain terminated with a fluorine group in at least a part thereof. For example, perfluorooxetane derivatives, such as perfluorooxetane having a fluorine substituent in a side chain as described in JP-A-2001-278874, may be used. However, as these materials for the photosensitive liquid-repellent film have an exposure wavelength of 300 nm or less, the materials for the substrate 1 and the insulating film 3 require those materials that transmit the wavelengths of 300 nm or less (having a band gap of 4 electron volts (eV) or higher), and quartz and silicon oxide were used, respectively, in the above example. The silicon film may be a film prepared by coating and calcining in a sol-gel method, other than forming it by plasma chemical vapor deposition. Further, silicon nitride ($Si_3N_4$), silicon oxynitride (SiON), aluminum oxide ($Al_2O_3$) or zirconium oxide ($ZrO_2$) may be used other than silicon oxide. Further, the material for the substrate 1 may be synthetic quartz.

A method for shifting the photosensitive wavelengths of the photosensitive liquid-repellent film to a long wavelength of 300 nm or higher includes the following two ways. One is a photosensitive liquid-repelling film comprised of a molecule having a dye skeleton that thermally decomposes by absorbing the light having a wavelength of 300 nm to 700 nm, which specifically includes compounds 1 and 2 below.

Methods for synthesizing these compounds are shown below.

(Synthesis of Compound 1)

The compound 1 is synthesized by reactions (i) to (iii) below.

(i) Reduction of Liquid-repellent Material

Krytox 157FS-L made by Du Pont (average molecular weight 2,500) (50 parts by weight) is dissolved in PF-5080 made by 3M (100 parts by weight). The solution is added with lithium aluminum hydride (2 parts by weight) and heated and stirred for 48 hours at 80° C. The reaction solution is poured into ice water, and the lower layer is dispensed, washed with 1% hydrochloric acid and then washed with water until the washed solution becomes neutral. After removing water in the solution after washing by filtering with a filter paper, PF-5080 is evaporated by an evaporator to obtain a compound 3 (45 parts by weight) in which the terminal of Krytox 157FS-L is transformed to $CH_2OH$.

$F—[CF(CF_3)—CF_2O]_n—CF(CF_3)—CH_2OH$  n≅4

Compound 3

(ii) Introduction of Dye Skeleton

The compound 3 (45 parts by weight) is dissolved in HFE-7200 made by 3M (100 parts by weight). The solution

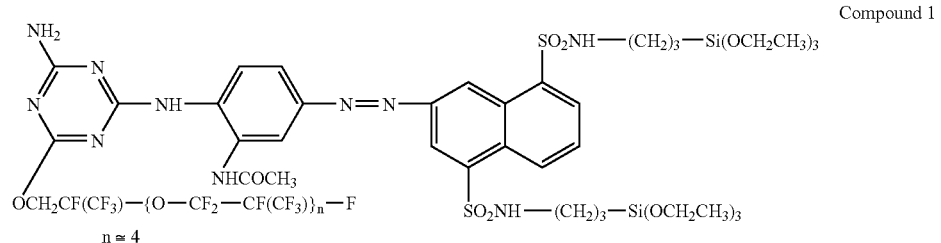

Compound 1

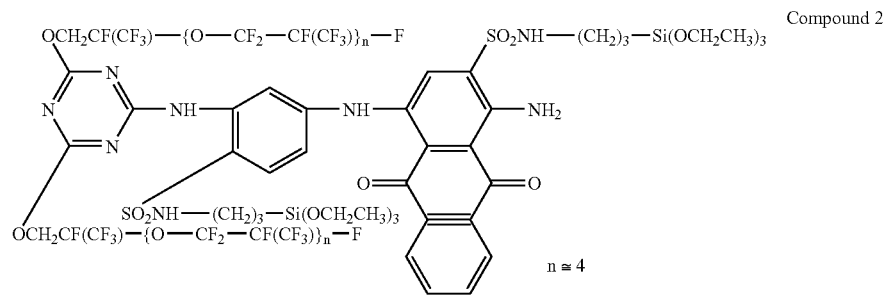

Compound 2 is added with Reactive Yellow 3 (another name: Procyon Yellow HA) (12 parts by weight), ethanol (100 parts by weight) and sodium carbonate (2 parts by weight) and refluxed for 30 hours. The structure of Reactive Yellow 3 is shown below.

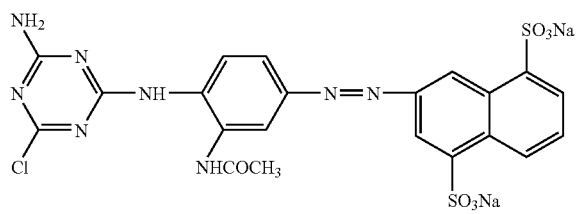

C.I. Reactive Yellow 3

The solvents in the reaction solution (HFE-7200 and ethanol) are evaporated by an evaporator. The residue is added with a mixture of HFE-7200 (100 parts by weight), hydrochloric acid of 35% by weight (100 parts by weight) and ice water (100 parts by weight), vigorously stirred and then left at rest. The lower layer is dispensed and washed with water until the washed solution becomes neutral. After removing water in the solution after washing by filtering with a filter paper, HFE-7200 is evaporated by an evaporator to obtain a compound 4 (45 parts by weight) in which Reactive Yellow 3 is combined with the compound 3.

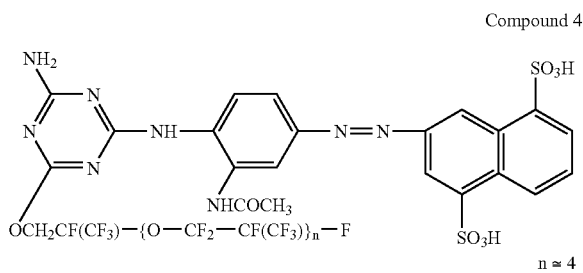

Compound 4

$n \simeq 4$ (iii) Reaction for Introducing Binding Site

The compound 4 (45 parts by weight) is dissolved in HFE-7200 (100 parts by weight). When the resultant solution is cooled to around 0° C., it is added with Sila-Ace S330 made by Chisso Corporation (10 parts by weight), N,N-dicyclohexylcarbodiimide (10 parts by weight), dichloromethane (20 parts by weight) and stirred for 3 hours. The reaction solution is returned to room temperature and further stirred for 30 hours. The reaction solution is left at rest and the lower layer is dispensed when the reaction solution is separated into two layers. Note that a hazy layer, which will be produced between the upper and lower layers, must not be added to the lower layer. The lower layer is washed with dichloromethane (20 parts by weight) several times and then filtered with a filter paper. Then, the solvent (HFE-7200) in the solution was evaporated by an evaporator to obtain the target compound 1 (40 parts by weight).

(Synthesis of Compound 2)

The compound 2 (40 parts by weight) was obtained in the same manner as the synthesis of the compound 1, except that Mikacion Brilliant Blue RS (7 parts by weight) was used in place of Reactive Yellow 3 (12 parts by weight).

The chemical structure of Mikacion Brilliant Blue RS is shown below.

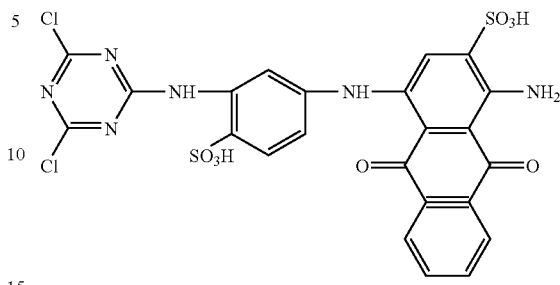

Mikacion Brilliant Blue RS

In some cases, a sodium sulfonate part is in the form of sulfonic acid. In these cases, it is transformed to sodium sulfonate with sodium hydroxide or the like before use.

When the above compounds 1 and 2 are used as the photosensitive liquid-repellent film, the substrate 1 and the insulating film 3 may only transmit any wavelengths within the above wide wavelength range. Therefore, a thin film having a thickness of 300 nm comprised of tantalum oxide ($Ta_2O_5$), zirconium oxide ($ZrO_2$) or lanthanum oxide ($La_2O_3$), as another inorganic material than silicon oxide ($SiO_2$), which is formed by plasma chemical vapor deposition or a sol-gel method, may be used for the insulating film 3. Further, a spin-coated film of polyvinylphenol (PVP) or polymethylmethacrylate (PMMA) may be used as an organic material. A typical glass substrate such as Corning 1737 or various plastic substrates may be used for the substrate 1.

Another method for shifting the photosensitive wavelengths of the photosensitive liquid-repelling film 4 to longer wavelengths uses a photocatalytic material in at least a part of the insulating film 3. The photocatalytic material has the effect of absorbing light to produce holes and electrons having strong oxidizing and reducing power in the film, decomposing organic materials adjacent to the photocatalytic material.

In this case, the above described all materials can be used for the photosensitive liquid-repellent film 4. For example, a photocatalytic material comprised of, for example, titanium oxide ($TiO_2$) is coated by a sol-gel method to form a film having a thickness of about 10 nm between the insulating film 3 and the photosensitive liquid-repellent film 4 as described by Tadanaga and Minami in Material Integration, 14(10), pp. 9–13 (2001). Since titanium oxide absorbs the light having a wavelength of 400 nm or less to cause photocatalysis, materials transmitting the light having a wavelength of 400 nm or less can be used for the substrate 1 and the insulating film 3. In this case, glass substrates and plastic substrates comprised of polyimides with high light transmittance may be used for the substrate 1. Furthermore, the above described inorganic materials can be used for the insulating film 3. However, organic materials had better not be used because they are decomposed by the photocatalytic material.

This is the same for a semiconductor material 7 to be described hereinafter, and so organic materials had better not be used for the same. Further, when using a so-called visible-light-responsive photocatalytic material which absorbs visible light of 600 nm or less to cause photocatalysis, materials that transmit the light having a wavelength of 600 nm or less can be used for the substrate 1 and the insulating film 3. Therefore, all the above described inorganic materials can be used.

A method for processing the photosensitive liquid-repellent film 4 using a photocatalytic material other than the above, in which organic materials can be used for the insulating film 3 and the semiconductor material 7, will be described in (Example 6).

A thin film transistor can be composed by forming the semiconductor film 7 on the electrode substrate of the present invention formed as described above, such that the semiconductor film 7 extends over and covers at least a part of each of the source electrode 5, drain electrode 6 and the insulating film surface having the gate electrode 2 in the lower part thereof. Following materials and production methods can be used for the semiconductor film 7. As for inorganic materials, an amorphous silicon film having a thickness of about 200 nm is formed by plasma chemical vapor deposition at a substrate temperature of 250° C. using silane and hydrogen ($SiH_4+H_2$). Then, the amorphous silicon film is processed to an island shape by dry etching using $SF_6$ as an etching gas to obtain the semiconductor film 7. Further, it may also be subjected to laser annealing to provide a polycrystalline silicon film. When inorganic materials are thus used for the semiconductor film 7, it is desirable to use inorganic materials such as silicon oxide and silicon nitride also for the insulating film 3. Further, the removal of the photosensitive liquid-repellent film from the surface of the insulating film 3 before forming the semiconductor film 7 is preferable for stabilizing the interface between the insulating film 3 and the semiconductor film 7, thus capable of obtaining good transistor characteristics. For example, the use of amorphous silicon provided equal performance to typical thin film transistors, in which field-effect mobility is 0.5 $cm^2/Vs$; threshold voltage is 2 V; and on/off current ratio is seven digits. As for organic materials, in the case of low-molecular weight substances, acene-based materials typified by pentacene and thiophene oligomers are used for film formation by vacuum deposition at a substrate temperature from room temperature to 100° C. Mask deposition or photolithography using oxygen as the etching gas is used to form the semiconductor film 7 processed in island shape. In the case of pentacene, it can be modified to a soluble precursor/derivative material in a solvent such as toluene or chloroform for film forming by a coating method such as casting, spin coating or dip coating. Furthermore, in the case of polymers, polythiophenes such as poly-3-hexylthiophene (P3HT) having a regio-regular structure (having the orientation in which the whole chain aligns in the same direction with head and tail adjacent to each other) that is a highly regular nano-structure, polyfluorenes such as a copolymer of fluorene-bithiophene (F8T2), and polyphenylenevinylene (PPV) are used for film forming by the coating methods described above. In the case of using organic materials for the semiconductor film 7, the transistor characteristics are improved when the semiconductor film 7 is formed on the photosensitive liquid-repellent film 4 on the gate electrode 2 without removing the photosensitive liquid-repellent film 4. For example, the deposited film of pentacene formed on the photosensitive liquid-repellent film 4 showed the performance of a field effect mobility of 1.0 $cm^2/Vs$, a threshold voltage of −2 V, and an on/off current ration of seven digits. However, when the pentacene film was formed on the insulating film from which the photosensitive liquid-repellent film 4 had been removed, the performance degraded to a field effect mobility of 0.2 $cm^2/Vs$, a threshold voltage of −5 V, and an on/off current ration of four digits. It is contemplated that the photosensitive liquid-repellent film 4 has the effect in improving the orientation order of organic semiconductor materials.

EXAMPLE 2

Figure 2:
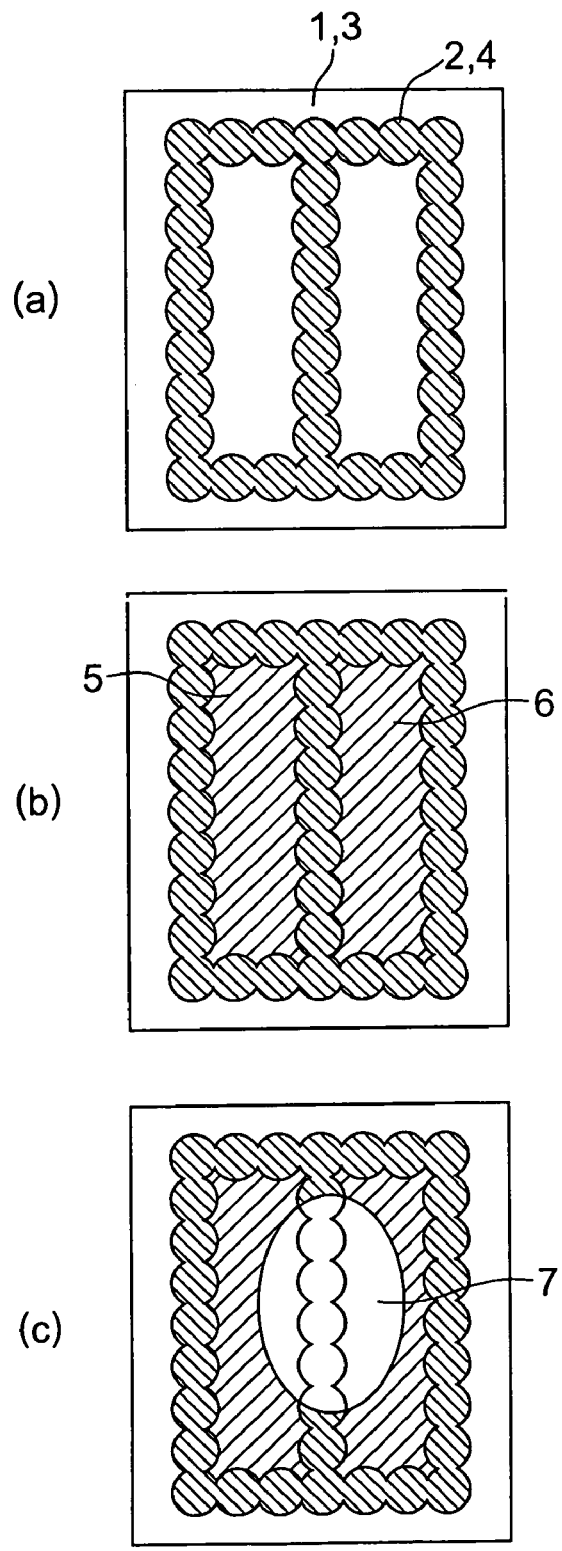
FIG. 2 is a plan view of a thin film transistor of the present invention prepared by a printing method.

In this example, the case in which the lower electrode 2 is formed by a printing method such as ink jet and the semiconductor film 7 is formed by casting will be described with reference to FIG. 2 showing a plan view of a thin film transistor. The same material and printing method as those used for the upper electrodes 5 and 6 in Example 1 can be used for the lower electrode 2. Other than the lower electrode 2, the same materials and methods as those used in Example 1 can be used. When an ink jet method is used, the lower electrode 2 which forms the gate electrode exhibits a shape in which dots are overlapped each other as shown in the figure. This is due to the fact that the conductive ink ejected from the head of ink jet isotropically wets and is spread over the uniform substrate 1 leaving the trace of a dot shape during the ejection. Even when the shape of the lower electrode 2 is thus deformed depending on the forming method, the photosensitive liquid-repellent film pattern having a generally same pattern as the shape of the lower electrode 2 is formed on the insulating film 3. Therefore, the upper electrodes 5 and 6 can be formed on the insulating film 3 as a shape in which the shape of the lower electrode 2 is generally reversed. When for example P3HT is coated on the upper electrodes 5 and 6 by casting, the semiconductor 7 may be formed in a misaligned position (an example shifted in an upper-right direction is shown in the figure). Even when such misregistration is produced, the thin film transistor of the present invention provided uniform switching characteristics. This is due to the following reason. Generally, the thin film characteristics vary and become nonuniform depending on the variations of the parasitic capacitance formed by the member sandwiched by the lower electrode 2, gate electrode, and the upper electrodes 5 and 6, source/drain electrodes. In a general thin film transistor structure, a so-called top-contact structure is used, in which the upper electrodes 5 and 6 are formed on the semiconductor film 7. In this case, when the upper electrodes and the semiconductor film are positioned in misregistration, the parasitic capacitance varies and the characteristics become nonuniform. On the other hand, in the present invention, the upper and lower electrodes are formed in a self-alignment manner to prevent misregistration. Further, the present invention provides a so-called bottom-contact structure in which the upper and lower electrodes are formed first and then the semiconductor film 7 is formed thereon, so the semiconductor film 7 is not sandwiched by the upper and lower electrodes and does not contribute to the parasitic capacitance. Consequently, the thin film transistor of the present invention provides uniform thin film transistor characteristics even when the upper and lower electrodes 2 and 4 and semiconductor film 7 are formed by a printing method. If the insulating film is also formed by a printing method, all can be formed by a printing method, thereby providing a thin film transistor having uniform characteristics.

EXAMPLE 3

Figure 3:
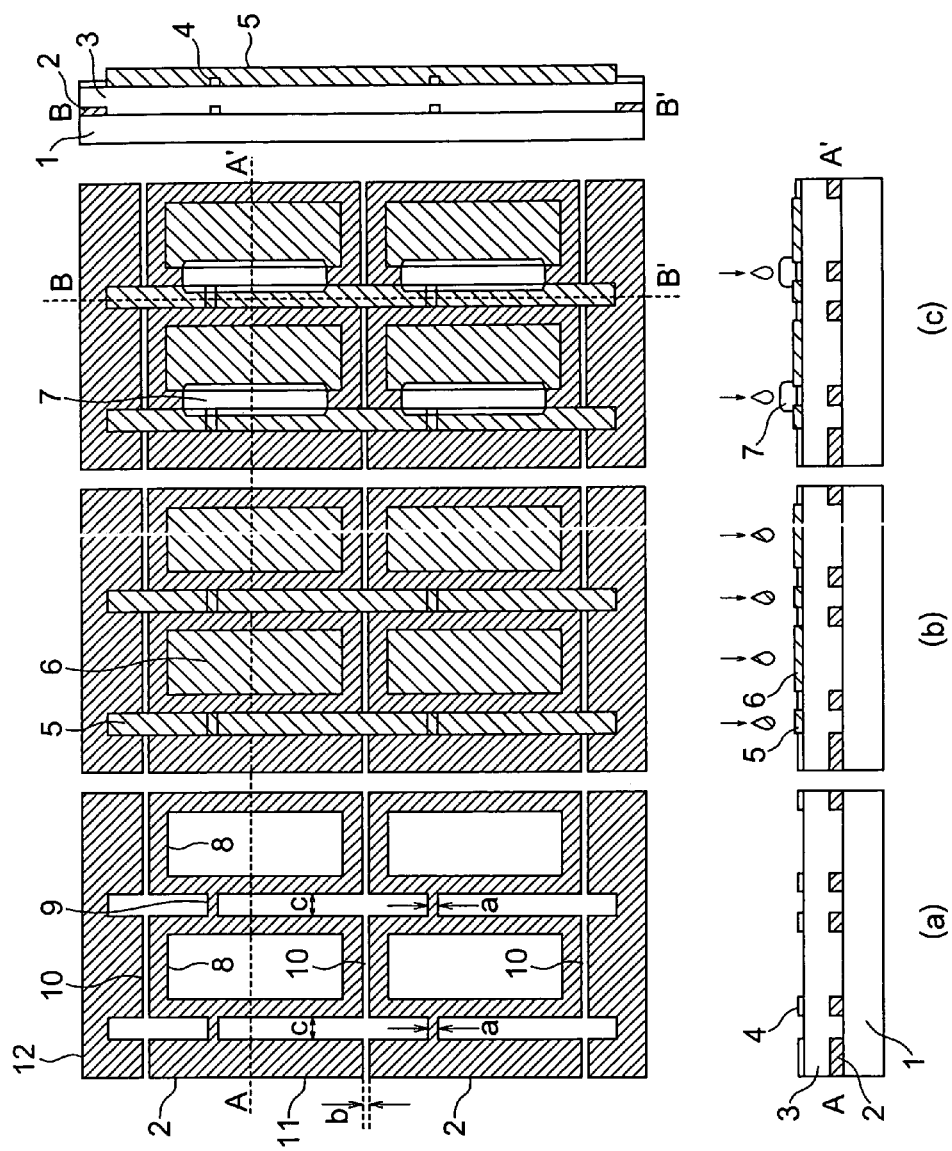
FIG. 3 shows-plan views and sectional views illustrating a 2×2 active matrix thin film transistor substrate of the present invention, and their production.

In the present example, a 2 row×2 column active matrix thin film transistor substrate comprising four thin film transistors formed at the intersections of two gate electrode wirings which form at least a part of the lower electrodes and two signal wirings which form at least a part of the upper electrodes, and a method for producing the same are described with reference to FIG. 3 showing a plan view and a sectional view. Materials and forming methods for respective layers of the present example are the same as those in Examples 1 and 2, so they will not be described except specifically required.

In the present example, in order to utilize the above described "non-penetrating effect of conductive ink" and "crosslinking effect of conductive ink" to form signal wirings/drain and source electrodes/pixel electrodes, the shape having the features shown in FIG. 3(a) is used as the pattern shape of the lower electrode 2 for mainly composing gate wirings/electrodes. Specifically, two gate wirings/electrodes, each of which is characterized by a shape in which adjacently placed two ring-shaped rectangles 8 each having an opening are connected at one connection part 9, are adjacently placed to each other through a space 10. A rectangular gate terminal 11 is connected at the left edge of the gate wirings/electrodes 2. Lower electrodes 12 for forming terminals to be utilized for forming terminals of signal wirings/drain electrodes 5 are adjacently placed at the upper and lower portions of the two gate wirings/electrodes through the spaces 10. Particularly, when a shape of the lower electrode 2, in which the width of the connection part 9 of the gate wiring/electrode (a in FIG. 3(a)) and the width of the space 10 between the gate wirings/electrodes and between the gate wiring/electrode and the lower electrode 12 for forming a terminal (b in FIG. 3(a)) are smaller than the width of the space between the adjacent rectangles 8 each having a ring-shaped opening (c in FIG. 3(a)), is used to coat and calcine a conductive ink along the space between the rectangles, an upper electrode 5, which acts as a signal wiring and a drain electrode, was formed. The upper electrode 5 had a continuous linear shape in which the connection part 9 was bridged along the space between the above described rectangles 8. Further, when a conductive ink was coated and calcined in the opening, the liquid-attracting region, of the ring-shaped rectangle 8, the upper electrode 6, which acts as the source electrode and pixel electrode, was formed in the opening in a self-alignment manner (FIG. 3(b)). The semiconductor films were formed on above described electrode substrate, such that the semiconductor films extend over and cover at least a part of each of the signal wirings/source electrodes 5, drain electrodes/pixel electrodes 6 and the insulating film surface having the gate wirings/electrodes 2 in the lower part thereof on the electrode substrate. Thereby, the active matrix thin film transistor substrate is completed in which four thin film transistors are placed on respective intersections of the gate wirings/electrodes 2 and signal wirings/drain electrodes 5. The point of the present example is to set the width of the space between the rectangles 8, that is, the width of the upper electrode c wider than the width a of the space 10 and the width b of the connection part 9 so that when coating and forming the upper electrode 5, which is the signal wiring/drain electrode, using the conductive ink, the conductive ink does not penetrate into the space 10 between the gate wirings/electrodes 2 to cause the short circuit between the upper electrodes 5, and the conductive ink does not stop spreading over the connection part 9 to break the upper electrode 5, thereby forming the upper electrode 5 continuously in the longitudinal direction, utilizing the "non-penetrating effect of conductive ink" and "crosslinking effect of conductive ink". Specifically, the above effect was produced by setting a=b=3 µm relative to c=15 µm.

Figure 4:
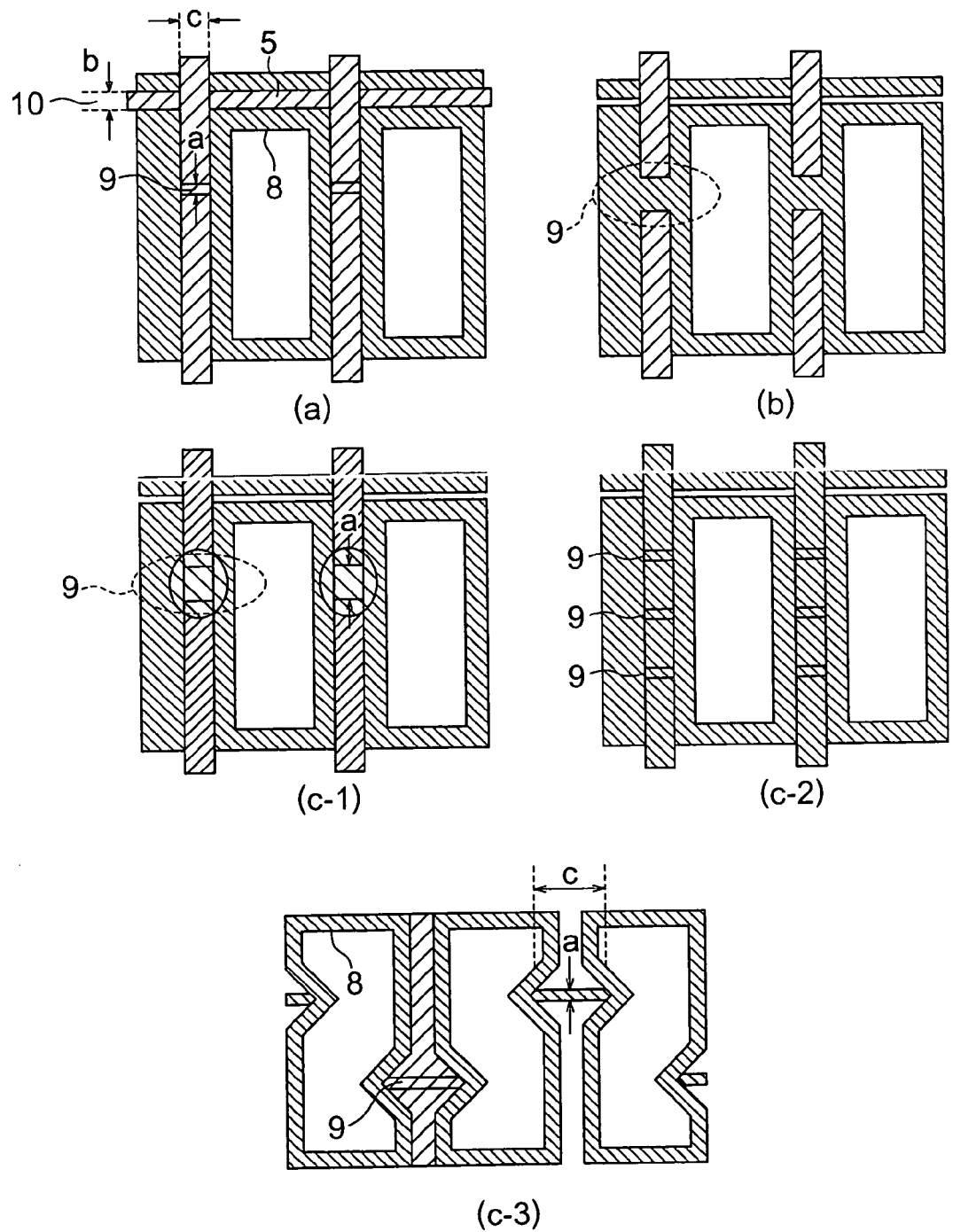
FIG. 4 is a plan view illustrating the relation of the shapes between a lower electrode and a signal wiring/drain electrode of the present invention.

The plan view illustrating the relation between the shape of the lower electrode and the shape of the signal wiring/drain electrode is shown in FIG. 4. FIG. 4(a) shows the case in which the width b of the space 10 is nearly equal to or more than the width c of the upper electrode 5. In this case, the conductive ink penetrated into the space 10 to cause the short circuit between the adjacent upper electrodes 5. FIG. 4(b) shows the case in which the width a of the connection part 9 is nearly equal to or more than the width c of the upper electrode 5. In this case, the conductive ink did not spread over the liquid-repellent region on the connection part 9 to cause disconnection. If the width a of the connection part 9 can be set large as in FIG. 4(b), the resistance of the gate wiring/electrode can be reduced, which would be advantageous to the thin film transistor substrate for use in the display device. As a measure to the disconnection, FIG. 4(c-1) shows an example in which the conductive ink is re-coated on the connection part for connection. At this time, it will be desirable to remove the photosensitive liquid-repellent film with a HeCd laser or the like before the re-coating and to use a conductive ink having a relatively higher viscosity. However, the problem of the correction by this method is that it requires time.

FIG. 4(c-2) shows an example in which the shape of the lower electrode is devised so as to prevent disconnection failure. In this example, a plurality of connection parts 9 is provided (3 parts in the figure), wherein even when the total width of the connection parts 9 is equal to or more than the width c of the upper electrode, each width of the connection parts is less than the width c of the upper electrode. Thereby, the each connection part can be passed over by the "crosslinking effect of conductive ink" to prevent the disconnection of the upper electrode 5 and at the same time the gate wiring/electrode can reduce the resistance. Specifically, disconnection occurred when providing one connection part having b=15 µm relative to c=15 µm, but when the connection part is divided into three each having the width of 5 µm, the disconnection was eliminated by crosslinking.

Further, FIG. 4(c-3) shows an example in which the ring-shaped rectangle is curved inside at the connection part 9 to locally increase the width c of the upper electrode. In this example, the width c can be designed wider than the width a of the connection part 9, so that the "crosslinking effect of conductive ink" is enhanced and the signal wiring part of the upper electrode can be formed without disconnection.

Figure 5:
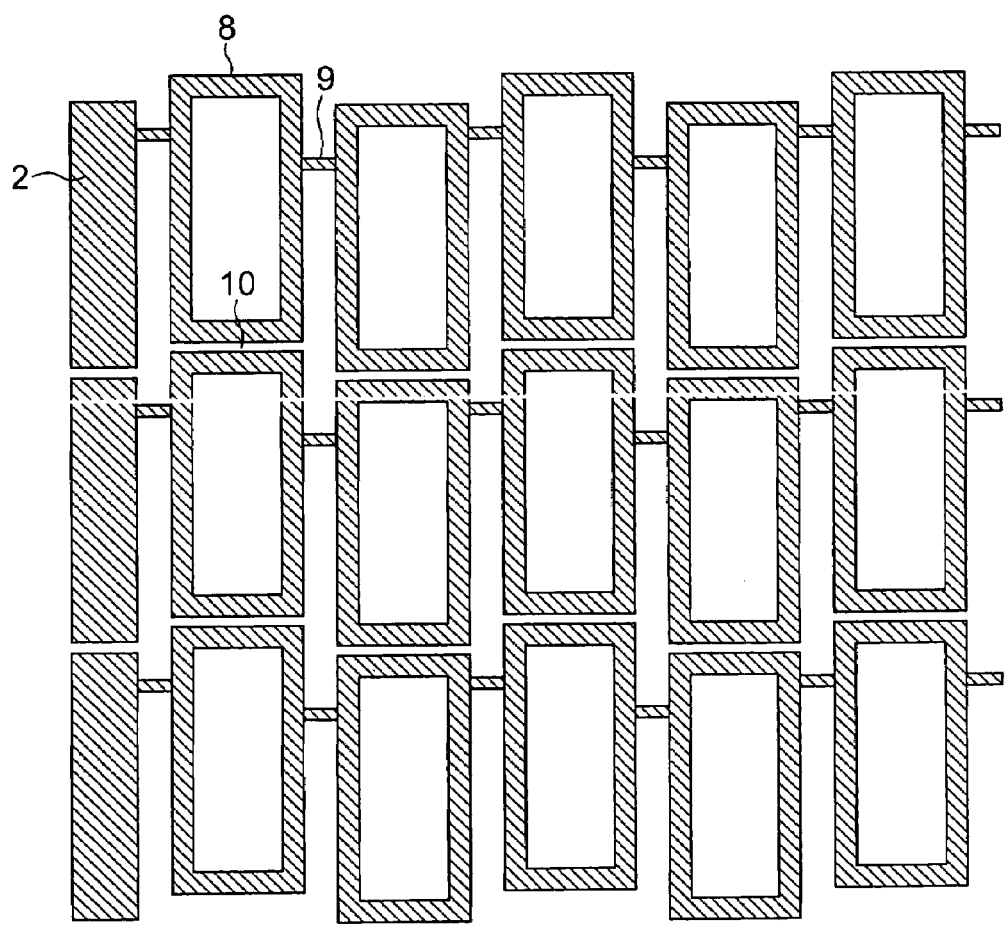
FIG. 5 shows a plan view illustrating the shape of a lower electrode (gate wiring/electrode) of the present invention.

In the examples shown in FIGS. 3 and 4, in the gate wirings/electrodes 2, adjacently placed ring-shaped rectangles 8 each having an opening are placed such that the upper and lower edges thereof are aligned horizontally. However, the present invention needs not be limited to this. For example, as shown in FIG. 5, a configuration, in which the rectangles 8 are placed in the positions alternately shifted up and down, may be adopted. In this case, the space 10 between the gate wirings/electrodes are not crossed linearly with the space between the rectangles 8 in which the signal wirings are to be formed. It was confirmed that this configuration has the effect to prevent the failure that when a conductive ink is dropped on the space between the rectangles 8, the ink does not flow into the space 10 in both right and left directions to cause disconnection or short circuit. Thus, it is possible to suppress the failure of disconnection and short circuit of the signal wirings formed in a coating process, not only by utilizing the non-penetrating effect of conductive ink by reducing the width of the space 10 as described above but also by devising the shape of the gate wirings/electrodes.

As described hereinabove, it was possible to form an active matrix thin film transistor substrate by forming an electrode substrate in which a gate wiring/electrode faces a signal wiring/drain electrode and a source electrode/pixel electrode through an insulating film in a self-aligned manner and placing a thin film transistor at the intersection of the gate wiring/signal wiring. All of the active matrix thin film transistor substrate can be produced by a printing method using the methods shown in Examples 1 and 2.

Finally, the conductive ink material for forming the upper electrodes 5 and 6 is referred to. When this substrate is used for the light-transmitting display device, the pixel electrode/source electrode 6 needs to be transparent, so coating-type ITO materials and conductive polymers described in Example 1 are used. When it is used for a reflective display device, it is effective to use Ag or the like having a high degree of reflection in the visible light wavelength region for improving the display performance.

EXAMPLE 4

Figure 6:
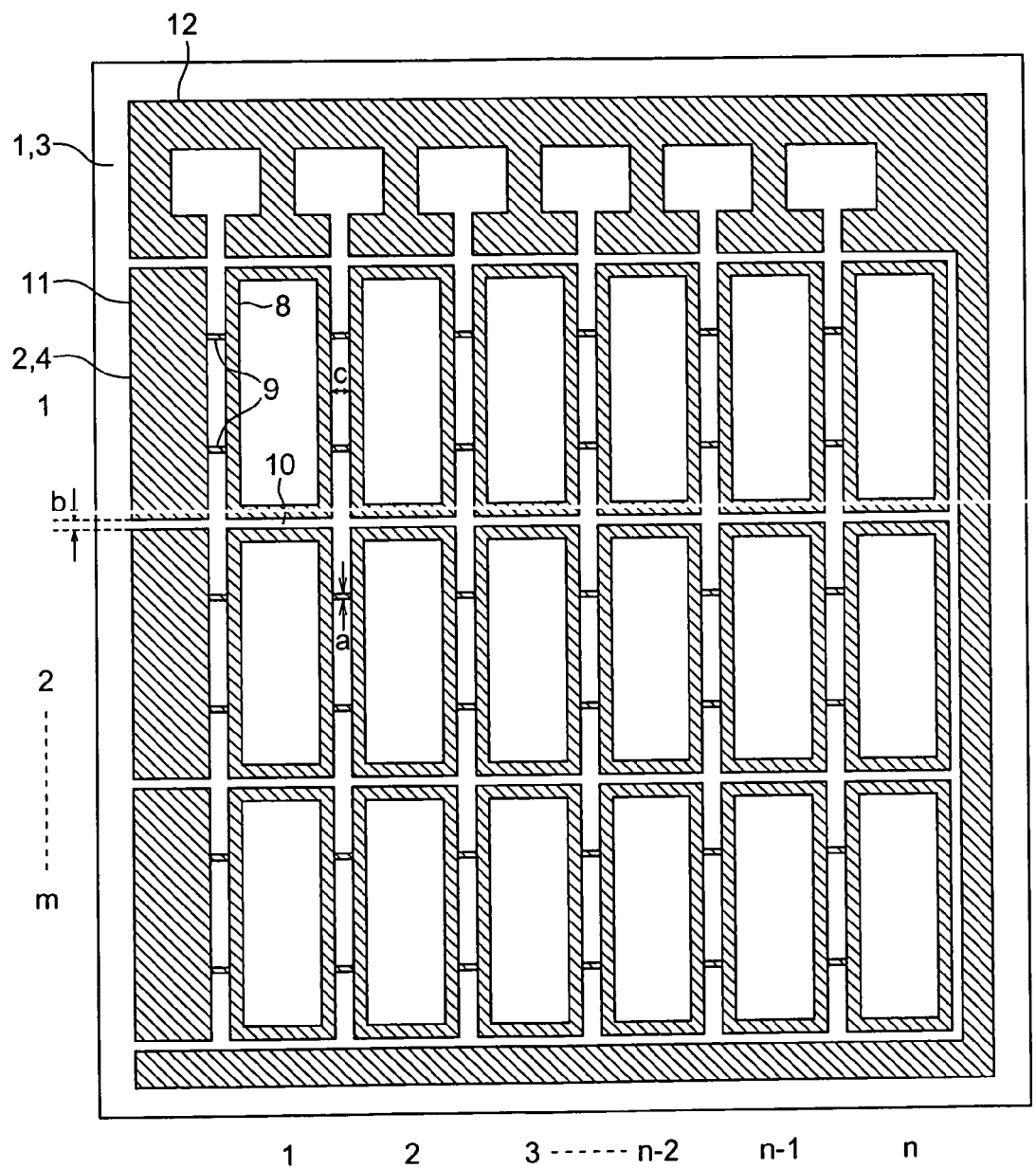
FIG. 6 is a plan view illustrating an m×n active matrix thin film transistor of the present invention and its production.
Figure 10:
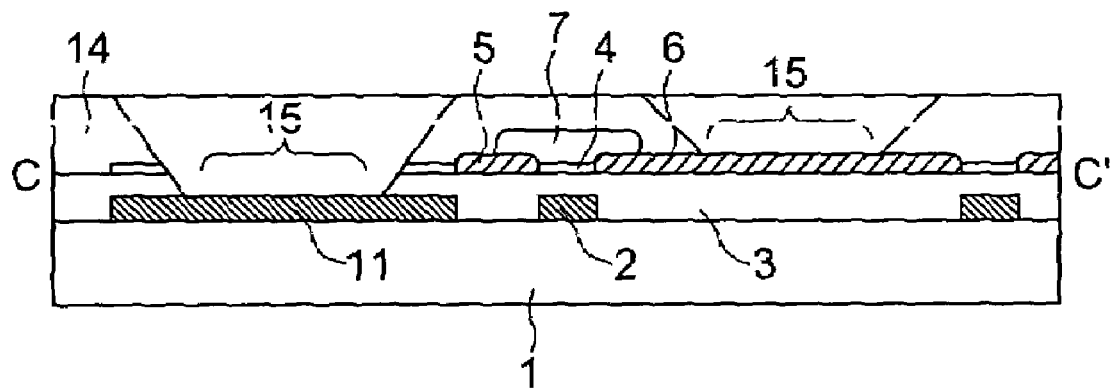
FIG. 10 is a sectional view illustrating an m×n active matrix thin film transistor of the present invention and its production.
Figure 11:
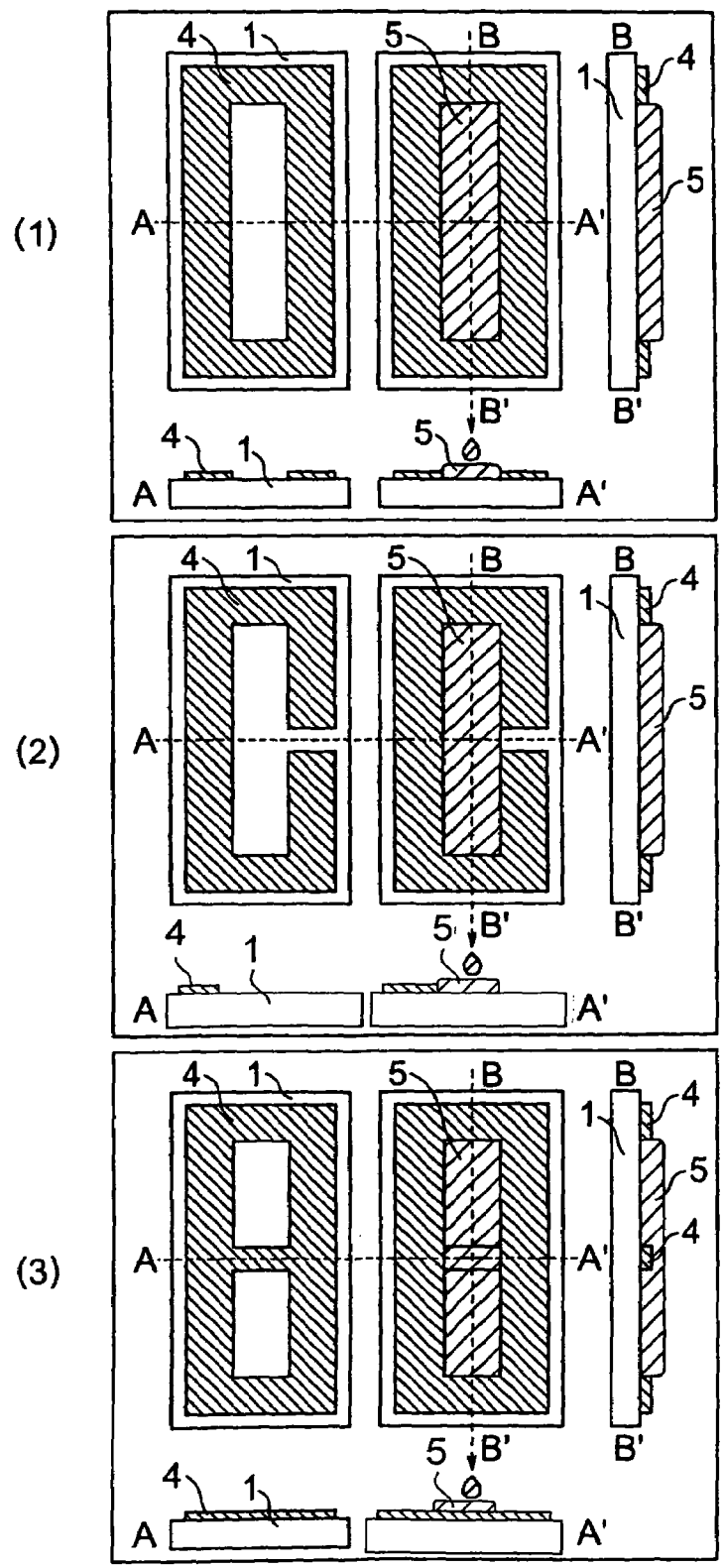
FIG. 11 is a view illustrating the principle of forming coated electrode patterns by a photosensitive liquid-repellent monolayer utilized in the present invention.
Figure 12:
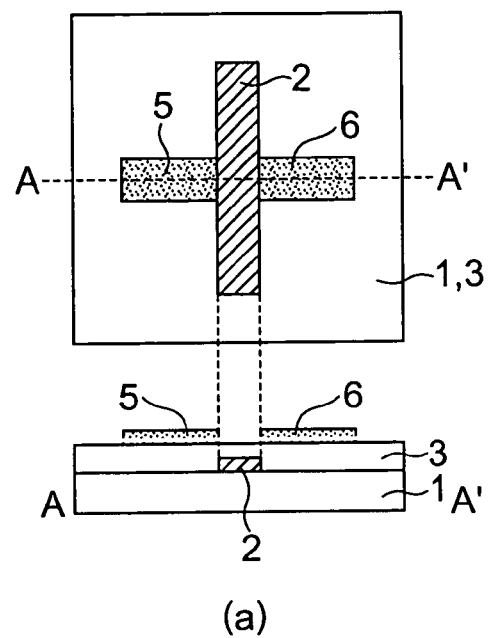
FIG. 12 is s plan view and s sectional view illustrating the problem of misregistration of electrodes in an electrode substrate.
Figure 12:
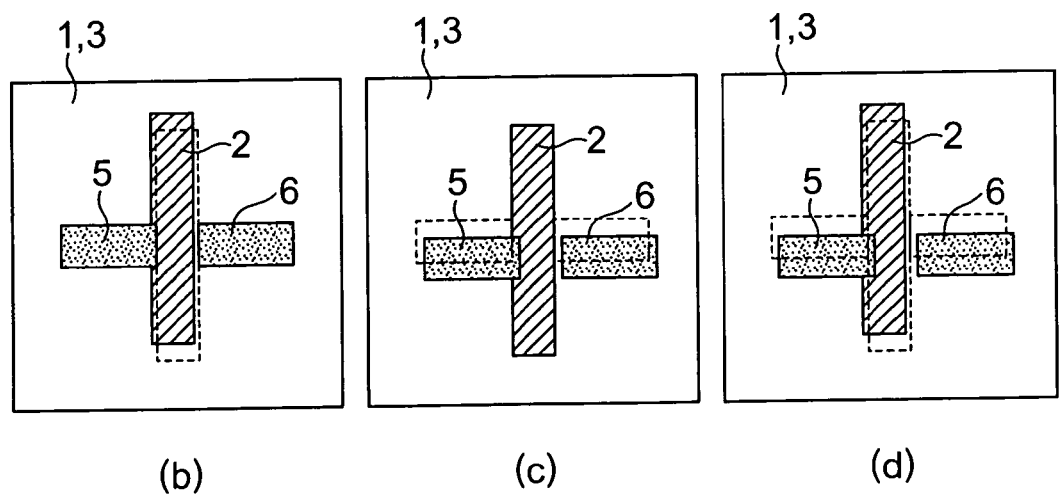

In the present invention, a m row×n column active matrix thin film transistor substrate comprising m×n pieces of thin film transistors formed at the intersections of m pieces of gate electrode wirings which form at least a part of the lower electrodes and n pieces of signal wirings which form at least a part of the upper electrodes, and a method for producing the same are described with reference to FIG. 6 showing a plan view and FIG. 10 showing a sectional view. Basic configuration is the same as that in Example 3. First, m pieces of gate wirings/electrodes 2, in which adjacently placed n pieces of ring-shaped rectangles each having an opening are connected to each other at least at one connection part 9 or more (two in the present example), are adjacently placed to each other through spaces 10 (FIG. 6). Particularly, when the width b of the space 10 and the width a of each of the connection parts 9 are designed to be equal to or more than the space c between the rectangles each having a ring-shaped opening, it is possible to form n pieces of upper electrodes 5 which act as the signal wirings/drain electrodes in a continuous linear shape self-aligned to the lower electrode by spreading over the liquid-repellent regions on the connection parts 9, by coating a conductive ink on the space c and calcining it. The penetration of the conductive ink into the spaces 10 to short the upper electrodes 5 to each other will not occur.

Figure 7:
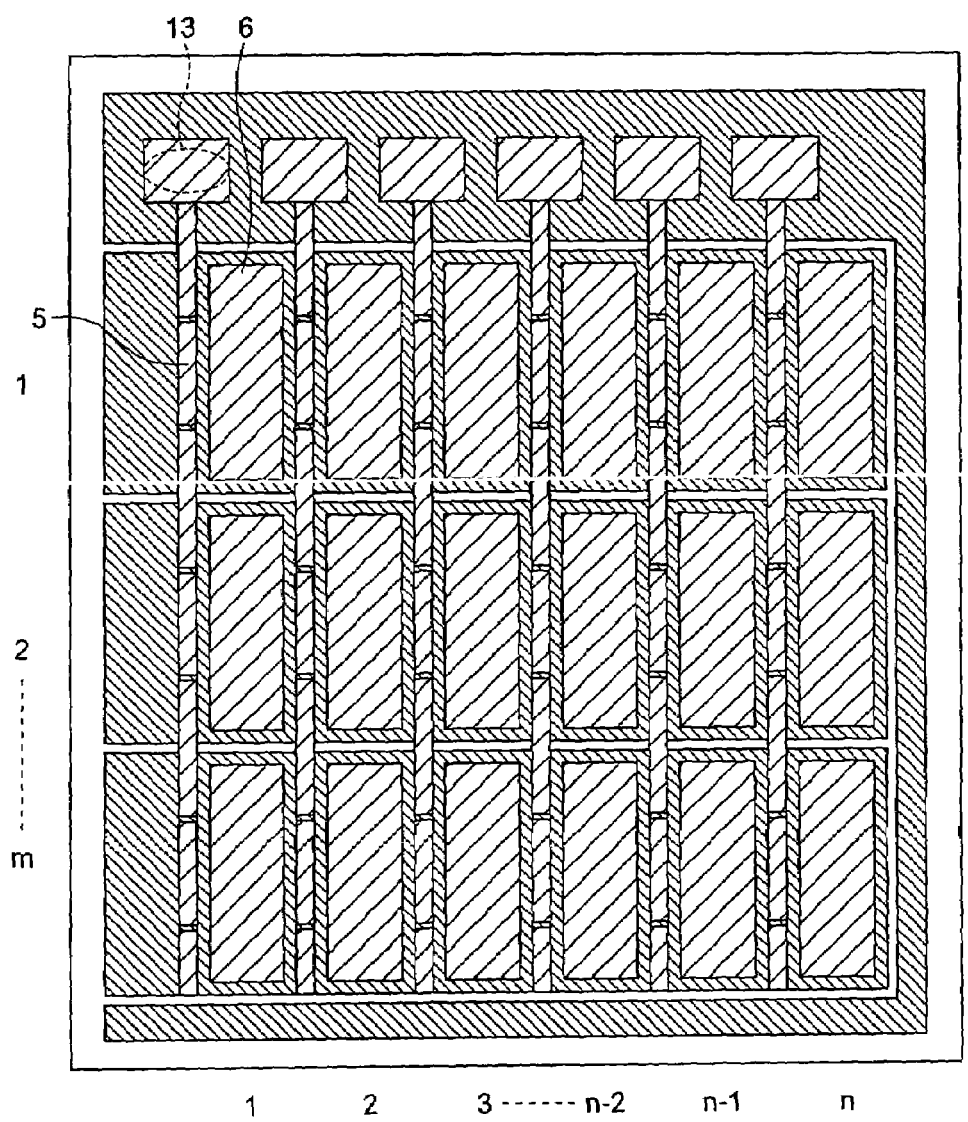
FIG. 7 is a plan view illustrating an m×n active matrix thin film transistor of the present invention and its production.
Figure 8:
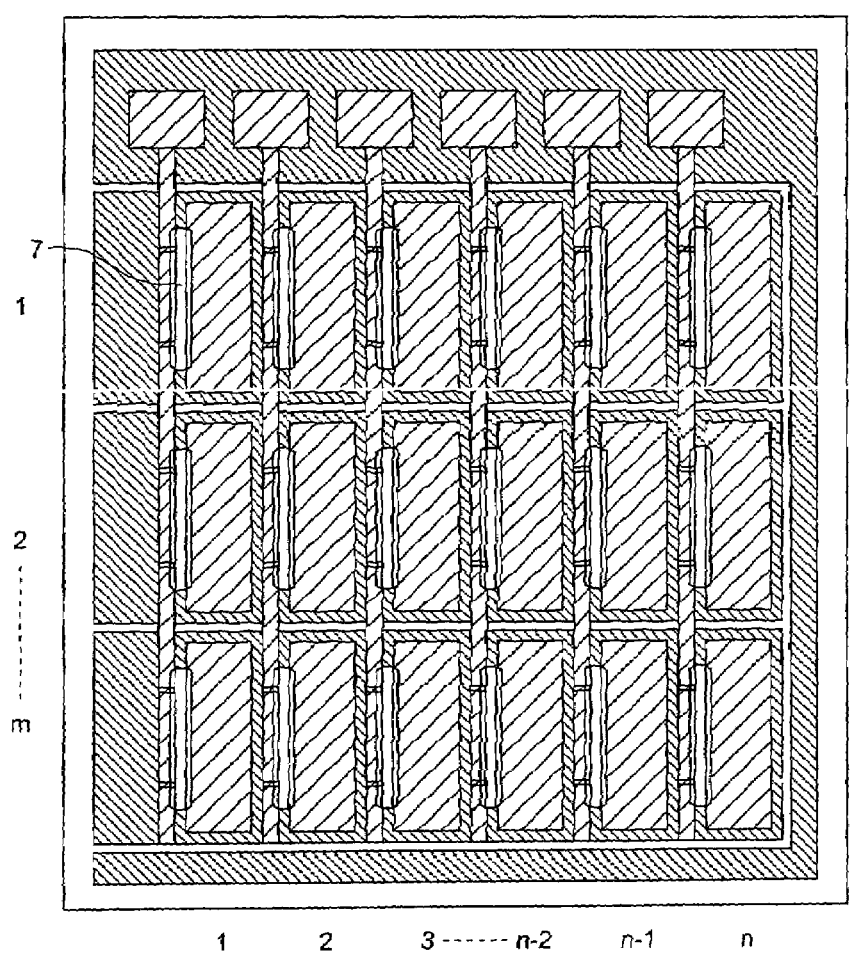
FIG. 8 is a plan view illustrating an m×n active matrix thin film transistor of the present invention and its production.
Figure 9:
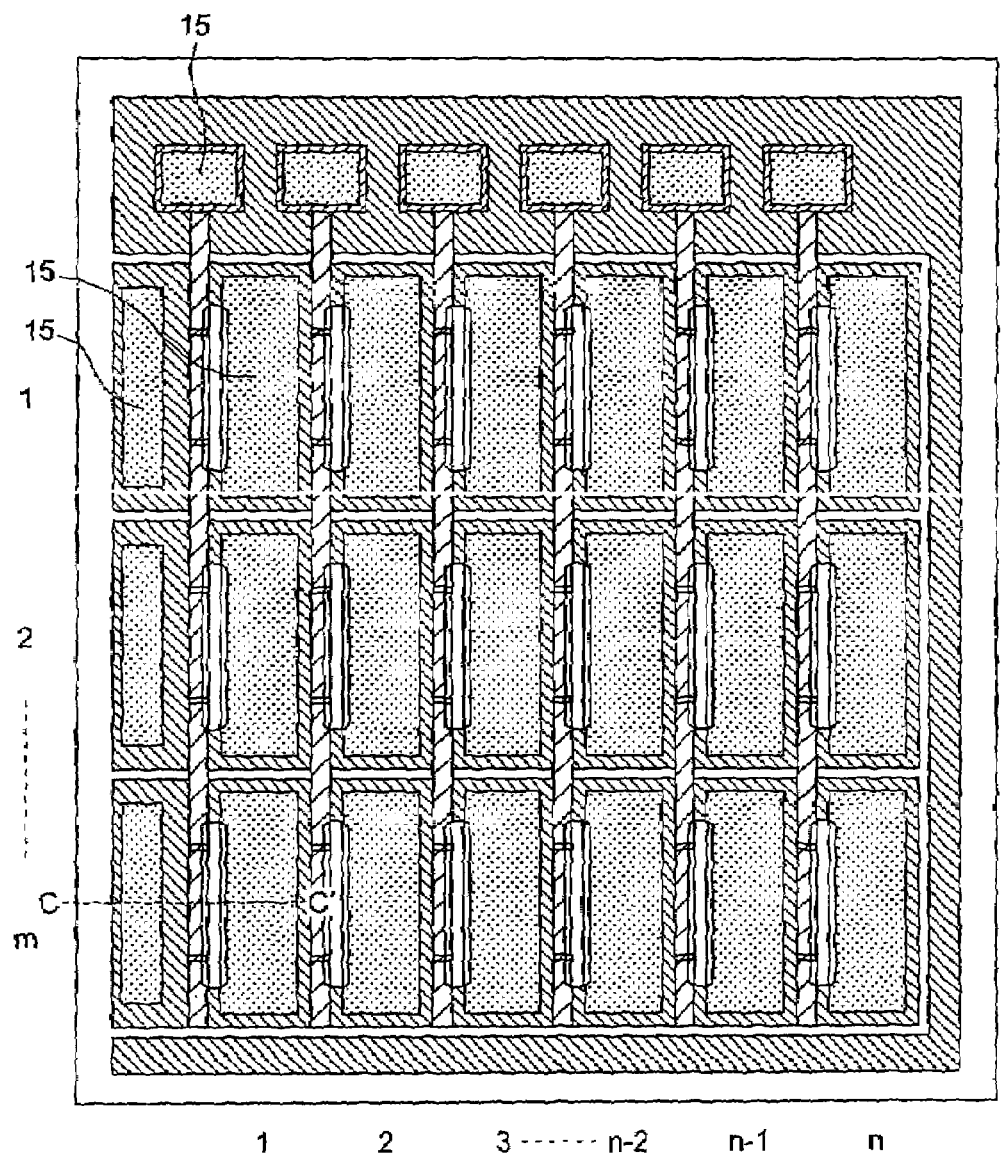
FIG. 9 is a plan view illustrating an m×n active matrix thin film transistor of the present invention and its production.

Further, in the present example, an integrally formed lower electrode 12 for forming terminals is placed surrounding the outer periphery of m pieces of the gate wirings/electrodes 2 as a part of the lower electrode 2. In order to prevent the formation of the upper electrodes 5 at the edge of the substrate 1 outside of the lower electrode 12 for forming terminals, a sealing mask may be applied on this part and removed after forming the upper electrodes 5. Furthermore, in the present invention, the width of the signal terminal part 13 for the lower electrode 12 for forming terminals was designed to be wider than the width c of the upper electrode. This is not only just for reducing the contact resistance with the signal circuit to be described hereinafter by increasing the area of the upper electrode terminal, but also for utilizing it as ink reservoirs for coating and forming the relatively long signal wirings 5 with a conductive ink. Namely, when the conductive ink dropped along the space having the width c for forming the wirings 5 is too much, the conductive ink flows into the signal terminal part 13, and when it is too few, the conductive ink is supplied from the signal terminal part 13. Thus, the ink reservoirs act such that the upper electrodes 5 can be formed with suitable amount of conductive ink (FIG. 7). By forming the semiconductor 7 on this electrode substrate using the similar placement, similar method and similar material as in Example 3, m×n pieces of thin film transistors are formed at the intersections of m pieces of gate wirings 2 and n pieces of signal wirings 5 (FIG. 8). Further thereon, a protective film 14 is formed. After forming the protective film 14, through holes 15 are formed by removing the protective film from above the pixel/source electrode 6, gate terminal 11, and signal terminal 13. The protective film and the thorough holes are formed, for example, by forming silicon nitride or silicon oxynitride using plasma chemical vapor deposition at a substrate temperature of 150° C. or higher, and by subjecting it to dry-etching processing by photolithography using $SF_6$ as an etching gas. At this time, it will be no problem that the position of the through holes is a little shifted, so printing of photoresist may be used for forming the same. Further, the protective film and through holes can be formed in one operation by mask exposure and development after coating and temporary calcining of an organic film comprised of a photosensitive polyimide or the like. When the printing method described in Example 3 and the above method for forming protective film/through holes are used in combination, an active matrix thin film transistor substrate can be formed in which the gate wiring/electrode 2 and the signal wirings/pixel electrodes 5 and 6 are placed in self-alignment through the insulating film 3 by using only a printing method without using photolithography. Furthermore, it is needless to say that when the lower electrode 2 is finely processed and formed using photolithography, the lower electrodes 5 and 6 can also be finely formed as a reversed pattern shape thereof, thereby forming an active matrix thin film transistor substrate with high definition.

EXAMPLE 5

Figure 14:
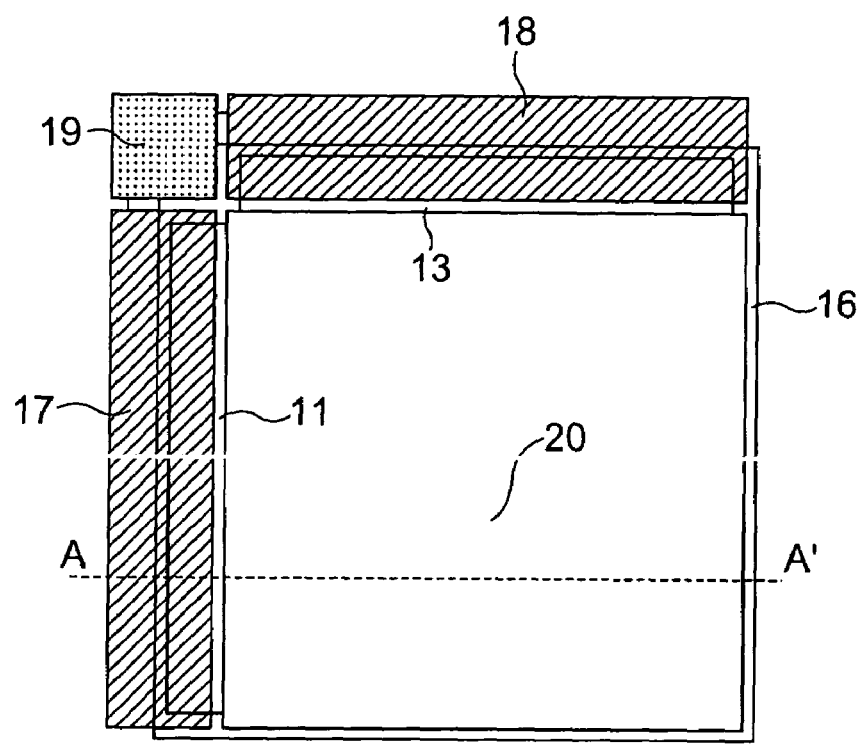
Figure 14:
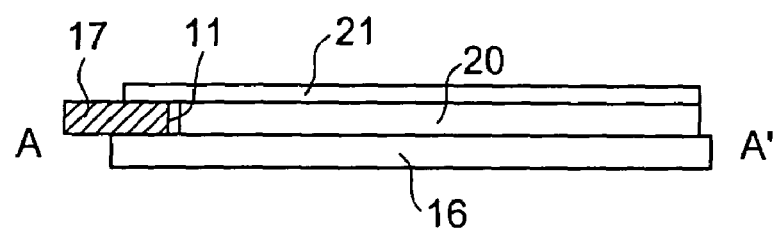

In the present example, the display device using the active matrix thin film transistor substrate of the present invention will be described with reference to FIG. 14 showing a plan view and a sectional view of the main device configuration. A gate scanning circuit 17 is connected to a gate terminal 11 of an active matrix thin film transistor substrate 16, and a signal circuit 18 is connected to a signal terminal 13 thereof, by a TAB (Tape Automated Bonding) method or a COG (Chip on Glass) method. The both circuits are further connected to a control circuit 19. Display elements 20 are sandwiched between each pixel electrode of the active matrix thin film transistor substrate 16 and an opposing electrode 21. The thin film transistor, which is connected to the gate wiring/electrode to which the scanning voltage that is output from the gate scanning circuit 17 is applied, is operated to apply the signal voltage supplied from the signal circuit synchronized with the scanning voltage to the pixel electrode connected to the thin film transistor, subjecting the display elements to so-called line sequential drive to operate the display device. As the display elements 20, capacitance driving elements such as liquid crystal display elements or electrophoresis elements can be applied to the configuration of the thin film transistor substrate of the present invention. In the case of the In-Plane-Switching liquid crystal display device, the opposing electrode 21 is constructed within the thin film transistor as is well known, so the configuration is different from the present figure. However, basically, the above can be applied in a same manner. Further, current driving display elements such as an organic electroluminescent device (OELD) can be applied, if a well known active matrix thin film transistor substrate for driving OELD is constructed according to the present invention. This display device can be applied to the flat display for cellular phones, flat TVs, note PCs and the like. Furthermore, it is needless to say that the thin film transistor of the present invention can be applied to all semiconductor devices utilizing thin film transistors such as RFID devices typified by non-contact IC cards, other than display devices.

EXAMPLE 6

In the present example, a back-surface exposure method and device configuration of a photosensitive liquid-repellent film are described with reference to FIG. 15 showing the schematic configuration thereof. A substrate 1, on which a lower electrode 2 and an insulating film 3 are layered in this order and then a photosensitive liquid-repellent film 4 is dip-coated, is provided. In this case, the photosensitive liquid-repellent film 4 is attached to the back-surface of the substrate 1 and to the surface of the insulating film 3. A photocatalyst film 24 typified by titanium oxide having a thickness of about 200 nm, which is formed on the surface of a supporting plate 23 comprised of aluminum or the like in which heating mechanism such as a sheathed heater is built, is adhered to the above substrate 1 (FIG. 15(a)). In order to improve the adhesion, it is effective to place a rubber sheet comprised of PDMS or the like between the supporting plate 23 and the photocatalyst film 24 as a cushioning material. When irradiating the back-surface of the substrate 1 with the light having the wavelengths that transmit the substrate and the insulating film and is absorbed by the photocatalyst film, hole carriers having a strong oxidizing power are produced on the surface of the photocatalyst film 24. These hole carriers directly decompose the adjacent photosensitive liquid-repellent film and the photosensitive liquid-repellent film 4 is processed to a generally same pattern shape as the lower electrode 2. At this time, when the photocatalyst film 24 was preliminarily heated by the heating mechanism to 100° C. or above, the pattern processing accuracy of the photosensitive liquid-repellent film 4 was improved, and it was possible to process it to a minimum pattern width of 3 μm. It is contemplated that when moisture attaches to the surface of the photosensitive liquid-repellent film, the hole carriers will oxidatively decompose water to produce an OH group, which will indirectly decompose the photosensitive liquid-repellent film; and the OH group will float and move in the space between the photocatalyst film 24 and the photosensitive liquid-repellent film 4 to decompose and remove even the photosensitive liquid-repellent film 4 in a shielded region. When adsorbed moisture is preliminarily removed from the surface of the photosensitive film by heating, the indirect decomposition process by the OH group does not work, but only the direct decomposition process by the hole carriers having a short moving distance does work, improving the pattern processing accuracy of the photosensitive liquid-repellent film 4. In addition, the photocatalyst film 24 not with a irregular surface but with a smoother surface improves the adhesion between the photocatalyst film 24 and the photosensitive liquid-repellent film 4, improving the pattern processing accuracy and efficiency.

As described in Example 1, when titanium oxide is used as a photocatalytic material, the exposure wavelengths are 400 nm or less, and so materials to transmit these wavelengths are used for the substrate 1 and the insulating film 3. When a visible-light-responsive photocatalytic material such as nitrogen-doped titanium oxide is used, the exposure wavelengths are 600 nm or less, and so materials to transmit these wavelengths are used for the substrate 1 and the insulating film 3. In the present method, the photocatalytic material is not used in the insulating film, so organic materials having the above conditions can be used for the insulating film 3 and the semiconductor film 7. Further, when the photosensitive film is processed by the present method, the light having the wavelengths that do not directly process the photosensitive liquid-repellent film can be used. Therefore, as for the materials for the electrode substrate, when for example a fluorinated alkyl silane coupling agent having a photosensitive wavelength of 300 nm or less is used as the photosensitive liquid-repellent film 4, materials that are opaque to the photosensitive wavelengths of the photosensitive liquid-repellent film can be used for at least one of the substrate and the insulating film, such as a glass substrate such as Corning 1737 for the substrate 1 or an organic material such as PVP for the insulating film 3.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. An electrode substrate comprising
   a substrate,
   a lower electrode,
   an insulating film having a liquid-repellent region and a liquid-attracting region on a surface thereof and an upper electrode,
   wherein the lower electrode, the insulating film and the upper electrode are layered in this order on the substrate;
   wherein a pattern shape of the lower electrode generally matches with that of the liquid-repellent region on the surface of the insulating film; and
   wherein the upper electrode is formed mainly on the liquid-attracting region excluding the liquid-repellent region on the surface of the insulating film, such that the pattern shape of the upper electrode is a self-aligned shape in which the pattern shape of the lower electrode is generally reversed.

2. A thin film transistor comprising the electrode substrate according to claim 1 and a semiconductor film, wherein, on the electrode substrate, a gate electrode is formed as the lower electrode, and a source electrode and a drain electrode are formed as the upper electrodes on the respective liquid-attracting regions isolated into two or more regions by the liquid-repellent region formed on the surface of the insulating film in a pattern shape that generally matches with the lower electrode, such that the pattern shape of the upper electrodes is a self-aligned shape in which the pattern shape of the gate electrode, i.e., the lower electrode, is generally reversed; and wherein the semiconductor film is formed such that it extends over and covers at least a part of each of the source electrode, the drain electrode and the surface of the insulating film (gate electrode region) lying therebetween over/on said electrode substrate.

3. An active matrix thin film transistor substrate comprising the electrode substrate according to claim 1 and thin film transistors having semiconductor films, wherein, on the electrode substrate, a plurality of gate wirings/electrodes is formed as the lower electrodes, and a plurality of signal wirings, source/drain electrodes and pixel electrodes are formed as the upper electrodes on the liquid-attracting regions isolated into a plurality of regions by the liquid-repellent regions formed on the surface of the insulating film in a pattern shape that generally matches with the lower electrodes; wherein the semiconductor films are formed such that they extend over and cover at least a part of each of the source electrodes, drain electrodes and liquid-repellent regions (gate wiring/electrode regions) on the surface of the insulating films lying therebetween over/on the electrode substrate; and wherein the thin film transistors are each placed at each intersection of the gate wiring and signal wiring.

4. The active matrix thin film transistor substrate according to claim 3, wherein a plurality of gate wirings/electrodes, having a shape in which a plurality of adjacently placed ring-shaped rectangles each having an opening are connected to each other at least at one or more locations, are adjacently placed to each other as the lower electrodes; wherein signal wirings and source/drain electrodes are each formed on the space between said rectangles in a continuous shape spreading over the connection in a self-aligned manner with respect to said gate wirings/electrodes as the upper electrodes; and wherein the pixel electrodes are each formed in an opening of said ring-shaped rectangle.

5. The active matrix thin film transistor substrate according to claim 4, wherein a width of the connection part for connecting each of a plurality of rectangles each having an opening for composing gate wirings/electrodes and a width of a space between a plurality of gate wirings/electrodes are smaller than a width of a space between a plurality of rectangles each having an opening for composing gate wirings/electrodes.

6. A liquid crystal, electrophoresis, or organic electroluminescent display device, which comprises the thin film transistor substrate according to any one of claims 3 to 5 as an active matrix switch.

7. An RFID device, which comprises the thin film transistor according to claim 2 as at least a part thereof.

8. The electrode substrate, thin film transistor and active matrix thin film transistor substrate according to any one of claims 1 to 3, which comprises a photosensitive liquid-repellent monolayer comprising a carbon chain in which at least a part thereof is terminated with fluorine or hydrogen as a photosensitive liquid-repellent film.

9. The electrode substrate according to claim 1, wherein at least one of the substrate and the insulating film is formed by a material that does not transmit a light with a photosensitive wavelength of the liquid-repellent film.

10. The thin film transistor according to claim 2, wherein at least one of the substrate and the insulating film is formed by a material that does not transmit a light with a photosensitive wavelength of the liquid-repellent film.

11. The active matrix thin film transistor substrate according to any one of claims 3 to 5, wherein at least one of the substrate and the insulating film is formed by a material that does not transmit a light with a photosensitive wavelength of the liquid-repellent film.

* * * * *